(12) United States Patent
Lee et al.

(10) Patent No.: US 11,844,247 B2
(45) Date of Patent: *Dec. 12, 2023

(54) ELECTRONIC PANEL AND ELECTRONIC DEVICE HAVING THE SAME

(71) Applicant: Samsung Display Co., LTD., Yongin-si (KR)

(72) Inventors: Minji Lee, Asan-si (KR); Hyungjun An, Cheonan-si (KR); Jeongoh Jin, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/151,461

(22) Filed: Jan. 8, 2023

(65) Prior Publication Data
US 2023/0232668 A1    Jul. 20, 2023

Related U.S. Application Data

(63) Continuation of application No. 16/905,831, filed on Jun. 18, 2020, now Pat. No. 11,574,971.

(30) Foreign Application Priority Data

Jul. 5, 2019  (KR) .................. 10-2019-0081492

(51) Int. Cl.
*G06F 3/041*    (2006.01)
*H10K 59/124*   (2023.01)
(Continued)

(52) U.S. Cl.
CPC .......... *H10K 59/124* (2023.02); *G06F 3/041* (2013.01); *H10K 50/844* (2023.02); *H10K 59/131* (2023.02); *H10K 59/40* (2023.02)

(58) Field of Classification Search
CPC .. H10K 59/124; H10K 50/844; H10K 59/131; H10K 59/40; H10K 59/1213;
(Continued)

(56) References Cited

U.S. PATENT DOCUMENTS

2007/0182720 A1   8/2007  Fujii et al.
2011/0006998 A1   1/2011  Kang et al.
(Continued)

FOREIGN PATENT DOCUMENTS

EP      3428718        1/2019
JP      2018180469     11/2018

OTHER PUBLICATIONS

European Search Report dated Dec. 3, 2020, issued to European Patent Application No. 20183758.0.
(Continued)

*Primary Examiner* — Temesghen Ghebretinsae
*Assistant Examiner* — Sosina Abebe
(74) *Attorney, Agent, or Firm* — H.C. Park & Associates, PLC

(57) ABSTRACT

An electronic panel including a display panel and an input sensor which includes a base layer, a first sensing electrode, a first signal line electrically connected to the first sensing electrode, a first insulating layer overlapping the first sensing electrode, a second sensing electrode, a second signal line electrically connected to the second sensing electrode, and a second insulating layer overlapping the second sensing electrode, in which the first insulating layer includes an open edge that defines an open area, the open area exposes a portion of a first surface of the base layer and a portion of the first signal line in a plan view, and the first insulating layer has a first thickness at a first point spaced apart from the open edge and a second thickness greater than the first
(Continued)

thickness at a second point disposed farther away from the open edge than the first point.

18 Claims, 25 Drawing Sheets

(51) Int. Cl.
    *H10K 50/844*    (2023.01)
    *H10K 59/40*     (2023.01)
    *H10K 59/131*    (2023.01)

(58) Field of Classification Search
    CPC ............. H10K 59/123; H10K 59/1315; H10K 59/122; H10K 59/00; H10K 50/80; G06F 3/041; G06F 2203/04103; G06F 3/0446; G06F 3/04164
    See application file for complete search history.

(56) References Cited

U.S. PATENT DOCUMENTS

| | | | |
|---|---|---|---|
| 2013/0264103 A1* | 10/2013 | Ye | H05K 3/38 174/254 |
| 2014/0367658 A1* | 12/2014 | Kwak | H01L 23/562 257/773 |
| 2014/0375909 A1* | 12/2014 | Misaki | G02F 1/13338 349/12 |
| 2016/0062018 A1* | 3/2016 | Namkung | G02B 5/3083 359/489.07 |
| 2016/0179229 A1* | 6/2016 | Ahn | G06F 3/0443 345/173 |
| 2016/0306472 A1* | 10/2016 | Park | G06F 3/0446 |
| 2018/0182820 A1* | 6/2018 | Kim | G06F 3/0412 |
| 2018/0308903 A1 | 10/2018 | Jeong et al. | |
| 2019/0014671 A1 | 1/2019 | Ahn et al. | |
| 2019/0019855 A1 | 1/2019 | Park et al. | |

OTHER PUBLICATIONS

Non-Final Office Action dated Apr. 2, 2021, in U.S. Appl. No. 16/905,831.
Final Office Action dated Aug. 6, 2021, in U.S. Appl. No. 16/905,831.
Non-Final Office Action dated Dec. 21, 2021, in U.S. Appl. No. 16/905,831.
Final Office Action dated May 9, 2022, in U.S. Appl. No. 16/905,831.
Notice of Allowance dated Oct. 5, 2022, in U.S. Appl. No. 16/905,831.

\* cited by examiner

ELECTRONIC PANEL AND ELECTRONIC DEVICE HAVING THE SAME

CROSS-REFERENCE TO RELATED APPLICATION

This application is a Continuation of U.S. patent application Ser. No. 16/905,831, filed on Jun. 18, 2020, which claims priority from and the benefit of Korean Patent Application No. 10-2019-0081492, filed on Jul. 5, 2019, each of which is hereby incorporated by reference for all purposes as if fully set forth herein.

BACKGROUND

Field

Exemplary embodiments of the invention relate generally to an electronic panel and an electronic device having the same, and more specifically, to an electronic panel with reduced defects and an electronic device having the electronic panel.

Discussion of the Background

Electronic devices, such as a smartphone, a tablet computer, a notebook computer, and a smart television set, are being developed, which generally include a display device to provide information. The electronic devices further include various electronic modules in addition to the display device, such as an electronic panel.

When the electronic devices are manufactured by assembling the display device and the electronic modules, defects may occur while assembling the display panel and the electronic module.

The above information disclosed in this Background section is only for understanding of the background of the inventive concepts, and, therefore, it may contain information that does not constitute prior art.

SUMMARY

Electronic panels and electronic device including the same constructed according to exemplary embodiments of the invention are capable of reducing cracks in an insulating layer.

Additional features of the inventive concepts will be set forth in the description which follows, and in part will be apparent from the description, or may be learned by practice of the inventive concepts.

An electronic panel according to an exemplary embodiment includes a base layer, a signal line disposed on the base layer, and an insulating layer disposed on the base layer and including an open edge that contacts the signal line and defines an open area, the open area exposing a portion of the base layer and an end portion of the signal line when viewed in a plan view, in which the insulating layer has a first thickness at a first point spaced apart from the open edge, and a second thickness greater than the first thickness at a second point disposed farther away from the open edge than the first point.

A thickness of the insulating layer may gradually decrease from the second point to the open edge.

The insulating layer may have a step between the second point and the open edge.

The insulating layer may include an organic layer contacting the signal line.

The electronic panel may further include an input sensing electrode connected to the signal line.

The signal line may include a first signal line disposed on a first surface of the base layer and a second signal line disposed on a second surface of the base layer opposing the first surface, and the insulating layer may include a first insulating layer disposed on the first surface of the base layer, overlapping the first signal line, and defining a first open area exposing a portion of the base layer and an end portion of the first signal line, and a second insulating layer disposed on the second surface of the base layer, overlapping the second signal line, and defining a second open area exposing another portion of the base layer and an end portion of the second signal line, and the first open area of the first insulating layer may not overlap with the second open area of the second insulating layer when viewed in a plan view.

The electronic panel may further include a pixel electrically connected to the signal line.

The pixel may include a light emitting diode.

The electronic panel may further include a circuit element layer disposed on the base layer and including a transistor, a display element layer disposed on the circuit element layer and including a light emitting diode, an encapsulation layer disposed on the display element layer, and an input sensing electrode disposed on the encapsulation layer, in which the signal line may be electrically connected to the input sensing electrode.

The open area may extend to an edge of the base layer when viewed in a plan view.

An electronic panel according to another exemplary embodiment includes a base layer, a signal line disposed on the base layer, and an insulating layer disposed on the base layer and having a cover area and an edge area, the insulating layer including an open edge that contacts the signal line and defines an open area, the open area exposing a portion of the base layer and an end portion of the signal line when viewed in a plan view, in which a thickness of the insulating layer is constant in the cover area, and gradually decreases in the edge area towards the open edge.

An electronic device according to yet another exemplary embodiment includes a first electronic panel, and a second electronic panel electrically connected to the first electronic panel, the first electronic panel including a base layer, a signal line disposed on the base layer, and an insulating layer disposed on the base layer and including an open edge that contacts the signal line and defines an open area, the open area exposing an edge of the base layer, a portion of the base layer extending from the edge of the base layer, and an end portion of the signal line when viewed in a plan view, in which a first width of the open area that overlaps with the signal line is greater than a second width of the open area that does not overlap with the signal line.

The second electronic panel may include a circuit board.

The open area may include a first area having the first width and a second area having the second width, and the circuit board may overlap with the first area and the second area, and may not overlap with a first portion of the first area.

The electronic device may further include an anisotropic conductive material disposed between the end portion of the signal line and the circuit board.

The anisotropic conductive material may overlap with the first portion of the first area.

The insulating layer may have a first thickness at a first point spaced apart from the open edge, and a second thickness greater than the first thickness at a second point disposed farther away from the open edge than the first point.

The first electronic panel may further include an input sensing electrode connected to the signal line.

The first electronic panel may further include a pixel electrically connected to the signal line.

The first electronic panel may further include a circuit element layer disposed on the base layer and including a transistor, a display element layer disposed on the circuit element layer and including a light emitting diode, a thin film encapsulation layer disposed on the display element layer, and an input sensing electrode disposed on the thin film encapsulation layer and electrically connected to the signal line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
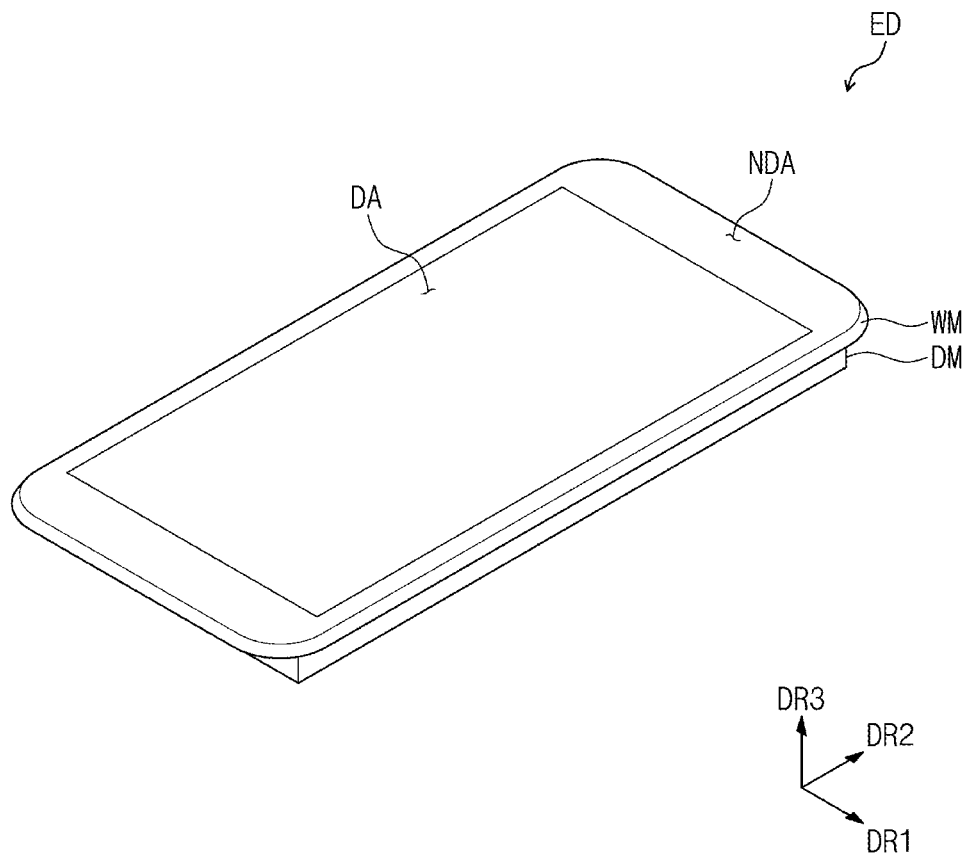
FIG. 1 is a perspective view showing an electronic device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described with reference to accompanying drawings.

FIG. 1 is a perspective view showing an electronic device ED according to an exemplary embodiment. In the illustrated exemplary embodiment, the electronic device ED is exemplarily shown as a display device applied to a smartphone, however, the inventive concepts are not limited thereto. The electronic device ED may include two or more panels (or substrates) electrically connected to each other. In addition, a plurality of electronic devices may be connected to each other to form one electronic device ED.

Referring to FIG. 1, a display surface for displaying an image is formed to be substantially parallel to a plane defined by a first directional axis DR1 and a second directional axis DR2. The display surface includes a display area DA and a non-display area NDA disposed adjacent to the display area DA. The non-display area NDA surrounds the display area DA. In particular, the non-display area NDA forms an edge of the display surface. In some exemplary embodiments, the non-display area NDA may be disposed only in two areas facing each other in the first directional axis DR1 or only in two areas facing each other in the second directional axis DR2. In other exemplary embodiments, the non-display area NDA may not be disposed on the display surface.

A third directional axis DR3 indicates a normal line direction of the display surface, e.g., a thickness direction of the electronic device ED. Front (or upper, or first) and rear (or lower, or second) surfaces of each member are defined to be distinguished from each other with respect to the direction in which the image is displayed. Hereinafter, first, second, and third directions respectively corresponding to directions indicated by the first, second, and third directional axes DR1, DR2, and DR3 and are assigned with the same reference numerals as the first, second, and third directional axes DR1, DR2, and DR3.

Referring to FIG. 1, the electronic device ED may include a window WM and a display module DM. The window WM provides a front surface of the electronic device ED. The display module DM is disposed on a rear surface of the window WM and generates the image. In addition, the display module DM senses a user's input, e.g., a user's touch and/or a user pressure application. The display module DM may be electrically connected to other electronic modules via a flexible circuit board or an electronic component connector.

Figure 2A:
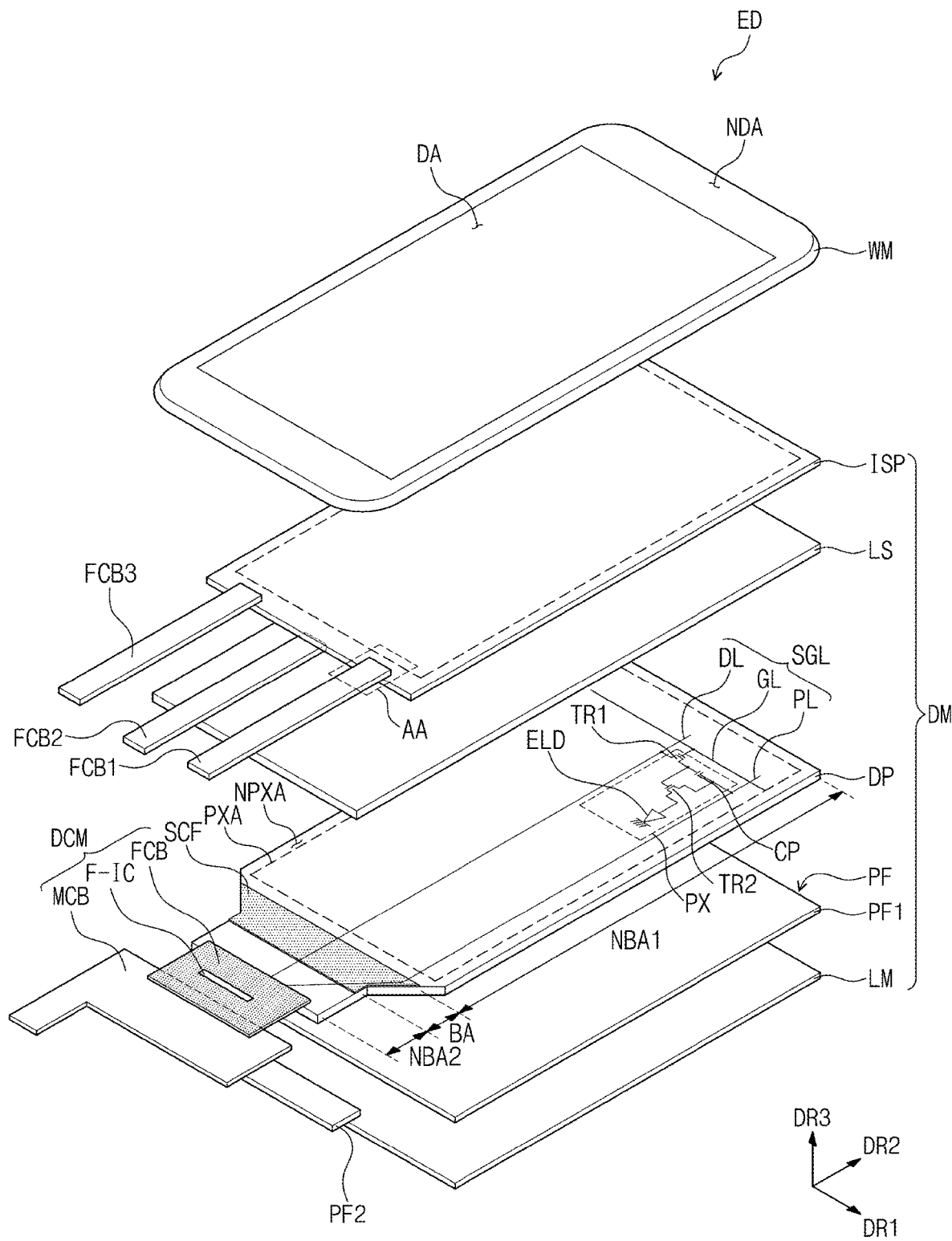
FIG. 2A is an exploded perspective view showing an electronic device according to an exemplary embodiment.
Figure 2B:
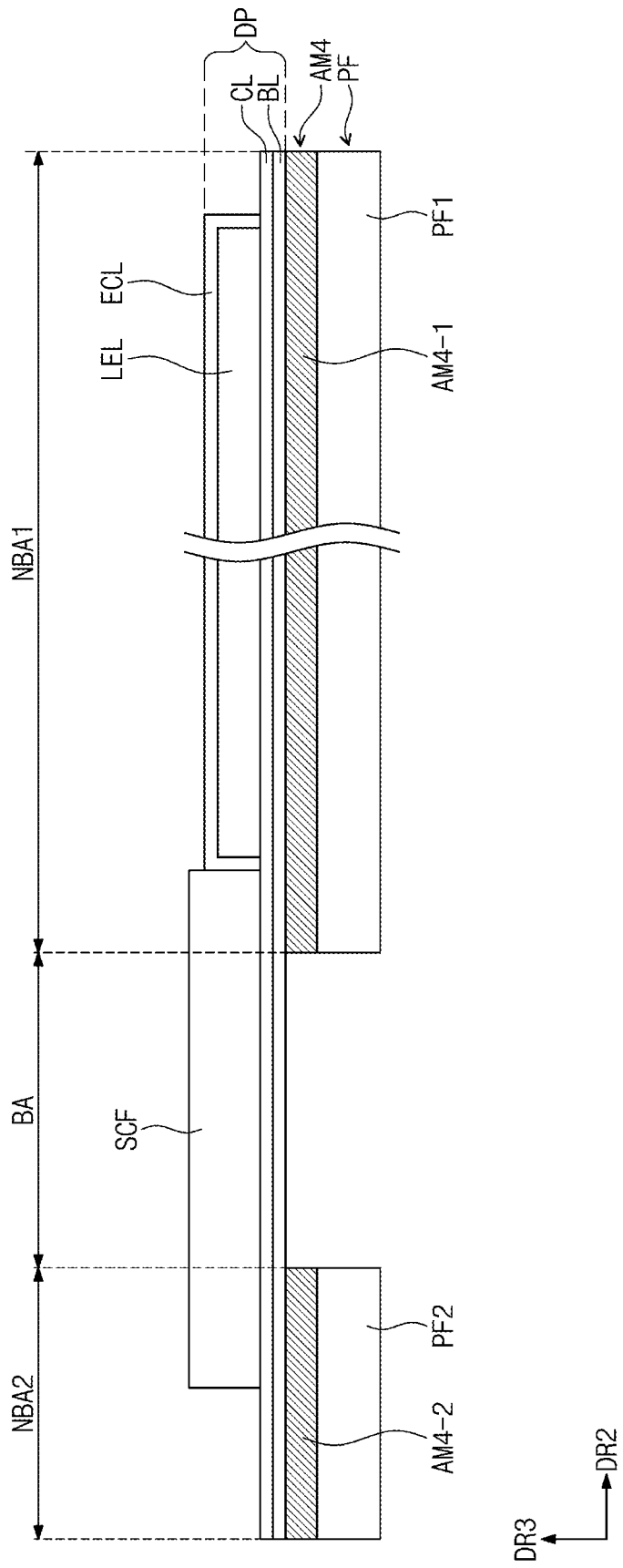
FIG. 2B is a cross-sectional view showing a display panel according to an exemplary embodiment.
Figure 2C:
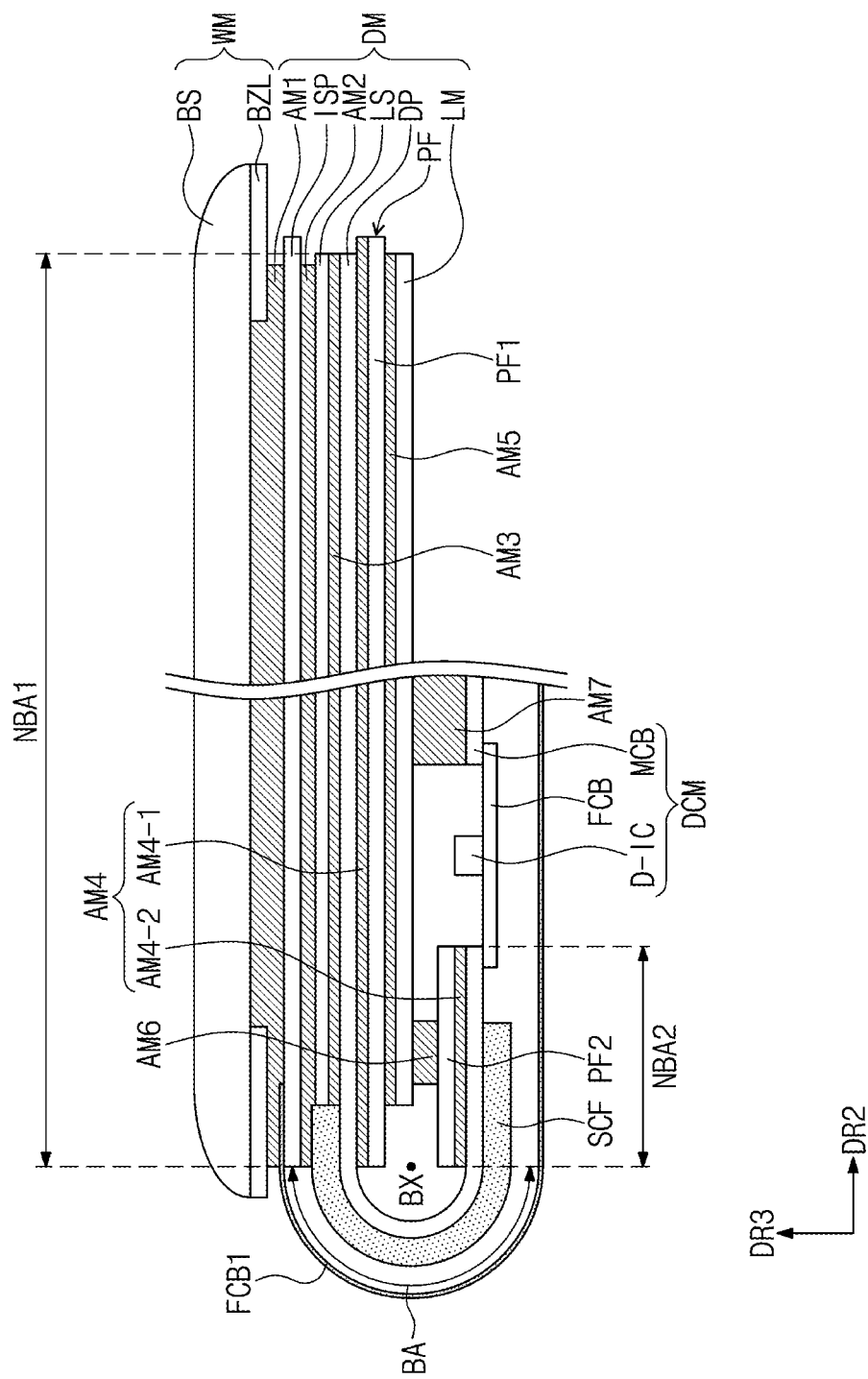
FIG. 2C is a cross-sectional view showing an electronic device according to an exemplary embodiment.
Figure 2D:
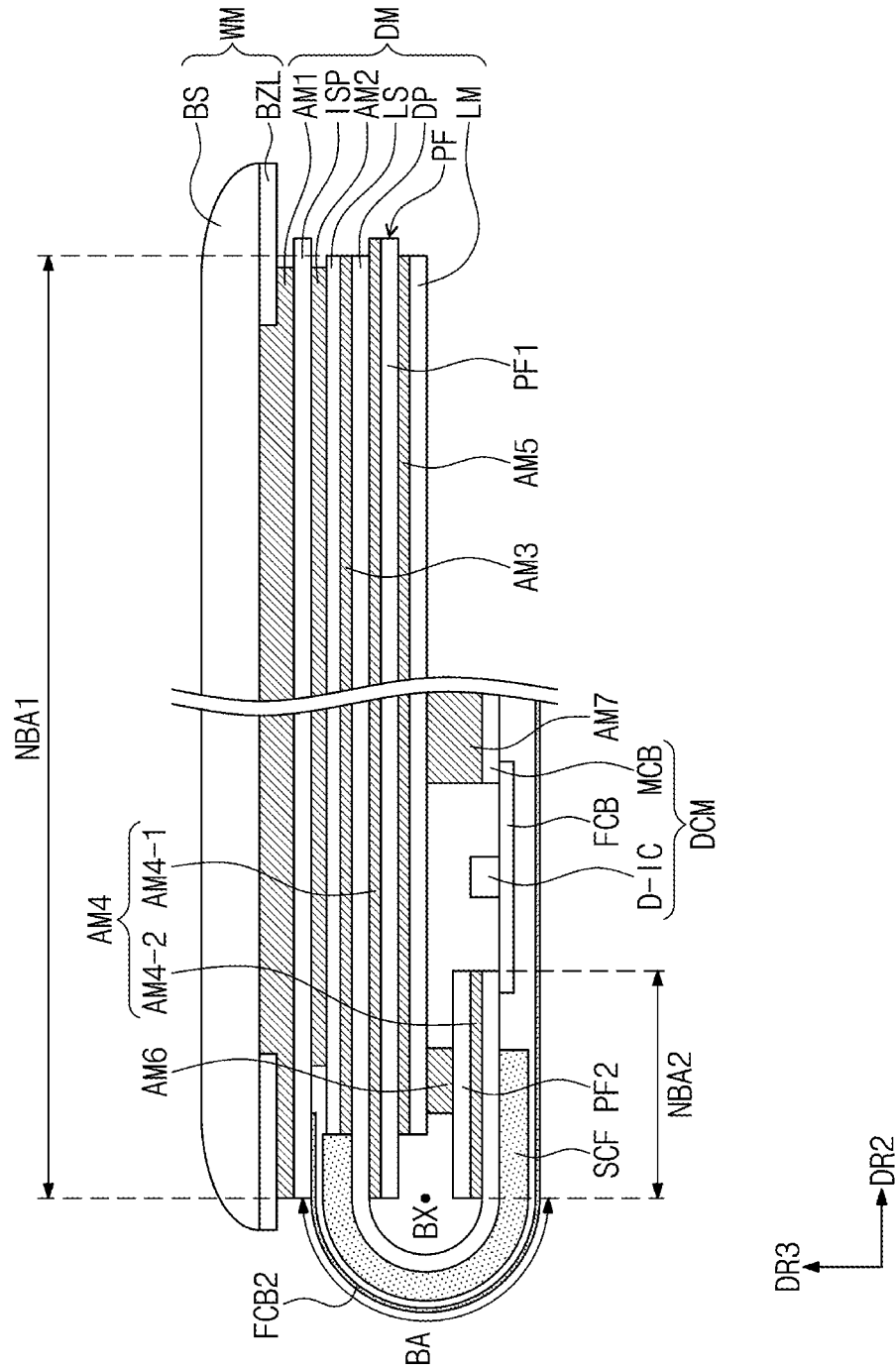
FIG. 2D is a cross-sectional view showing an electronic device according to an exemplary embodiment.

FIG. 2A is an exploded perspective view showing the electronic device ED according to an exemplary embodiment. FIG. 2B is a cross-sectional view showing a display panel DP according to an exemplary embodiment. FIG. 2C is a cross-sectional view showing the electronic device ED according to an exemplary embodiment. FIG. 2D is a cross-sectional view showing the electronic device ED according to an exemplary embodiment.

Referring to FIG. 2A, the electronic device ED includes the window WM and the display module DM. The window WM includes a base layer BS (refer to FIG. 2C) and a bezel layer BZL (refer to FIG. 2C) disposed on a lower surface of the base layer BS. An area in which the bezel layer BZL is disposed is defined as the non-display area NDA shown in FIG. 2A. In the illustrated exemplary embodiment, the window WM has a flat shape in the display area DA, however, the shape of the window WM may be changed in other exemplary embodiments. Edges facing each other in the first direction DR1 of the window WM may be provided with a curved surface.

The base layer BS may be a glass substrate, a sapphire substrate, or a plastic substrate. The base layer BS may have a single- or multi-layer structure. For example, the base layer BS may include a plurality of synthetic resin films coupled to each other by an adhesive. The base layer BS may include a glass substrate and a synthetic resin film coupled to the glass substrate by an adhesive member.

The bezel layer BZL may be directly disposed on a lower surface of the glass substrate or on one surface of the synthetic resin film. An organic material and/or an inorganic material may be directly deposited or printed on the glass substrate. The synthetic resin film on which the bezel layer BZL is formed may be attached to the lower surface of the glass substrate.

The bezel layer BZL may have a single- or multi-layer structure. The multi-layered bezel layer BZAL may include a buffer layer improving an adhesive force, a pattern layer providing a predetermined pattern, and an achromatic layer. The pattern layer may provide a pattern so-called a hairline. The achromatic layer may include an organic mixture including a black pigment or dye. The layers may be formed through a depositing, printing, or coating method, for example. In some exemplary embodiments, the window WM may further include a functional coating layer disposed on an upper surface of the base layer BS. The functional coating layer may include an anti-fingerprint layer, an anti-reflective layer, and a hard coating layer, for example.

Referring to FIG. 2A, the display module DM may include an input sensing panel ISP, an optical sheet LS, a display panel DP, a protective film PF, a driving control module DCM, connection circuit substrates FCB1, FCB2, and FCB3, a lower member LM, and a stress control film SCF. In some exemplary embodiments, at least one of the optical sheet LS, the protective film PF, and the stress control film SCF may be omitted.

The display module DM may substantially form an electronic device ED. In addition, each of the input sensing panel ISP, the display panel DP, the driving control module DCM, and the connection circuit substrates FCB1, FCB2, and FCB3 may be defined as an electronic panel (or an electronic substrate).

An adhesive member may be disposed between the input sensing panel ISP and the optical sheet LS, between the optical sheet LS and the display panel DP, between the display panel DP and the protective film PF, and between the protective film PF and the lower member LM. The adhesive member may include a conventional adhesive, and may be provided in a sheet type or a resin type. The adhesive member may be a pressure sensitive adhesive (PSA) film, an optically clear adhesive (OCA) film, or an optically clear resin (OCR).

The input sensing panel ISP obtains coordinate information about the user's input. The input sensing panel ISP may sense various types of inputs provided from the outside of the electronic device ED. For example, the input sensing panel ISP may sense an input from the user's body, and may sense various types of external inputs, such as light, heat, or pressure. In addition, the input sensing panel ISP may sense not only an input that comes into contact with a sensing surface but also an input that occurs near the sensing surface. The input sensing panel ISP may be an electrostatic capacitive type touch panel or an electromagnetic induction type touch panel.

The optical sheet LS shown in FIG. 2A may include a polarizer and a retarder. The polarizer and the retarder may respectively include a stretching-type polarizing film and a stretching-type retardation film. The number of retarders and a phase retardation length ($\lambda/4$ or $\lambda/2$) of the retarder may be determined according to an operation principle of the optical sheet LS. In an exemplary embodiment, the polarizer and the retarder may respectively be a coating-type polarizing film and a coating-type retardation film obtained by coating/aligning a liquid crystal composition on a base film. The stacking order of the optical sheet LS and the input sensing panel ISP may be interchanged.

The display panel DP shown in FIG. 2A may be a flexible display panel, e.g., an organic light emitting display panel. The display panel DP includes a pixel area PXA, in which a pixel PX is disposed, and a non-pixel area NPXA adjacent to the pixel area PXA when viewed in a plan view. The pixel PX is not disposed in the non-pixel area NPXA, and peripheral components, such as signal lines and insulating patterns, are disposed in the non-pixel area NPXA. The pixel area PXA and the non-pixel area NPXA may respectively correspond to the display area DA and the non-display area NDA. However, the inventive concepts are not limited thereto the illustrated exemplary embodiment.

The pixel PX may be provided in plural, and the pixels PX may be respectively connected to signal lines SGL. The pixel PX may include a first thin film transistor TR1, a second thin film transistor TR2, a capacitor CP, and a light emitting element ELD.

The first thin film transistor TR1 is connected to a gate line GL and a data line DL. The light emitting element ELD receives a power voltage provided through a power line PL. Pads connected to the data line DL and the power line PL are disposed in the non-pixel area NPXA.

FIG. 2B schematically shows a stacking structure of the display panel DP according to an exemplary embodiment. As shown in FIG. 2B, the display panel DP includes a base layer BL, a circuit element layer CL, a display element layer LEL, and an encapsulation layer ECL.

The base layer BL may include a synthetic resin film, e.g., a polyimide (PI) film, however, a material for the base layer BL is not particularly limited. The circuit element layer CL is disposed on an upper surface of the base layer BL. The circuit element layer CL has a multi-layer structure of an insulating layer, a conductive layer, and a semiconductor layer. The circuit element layer CL includes a pixel circuit, such as the first thin film transistor TR1, the second thin film transistor TR2, and the capacitor CP, and the signal lines SGL.

The display element layer LEL is disposed on an upper surface of the circuit element layer CL. The display element layer LEL may include the light emitting element ELD, e.g., an organic light emitting element. The encapsulation layer ECL is disposed on the display element layer LEL to encapsulate the display element layer LEL. The encapsulation layer ECL may have a multi-layer structure of an inorganic layer/an organic layer/an inorganic layer, and be referred to as a thin film encapsulation (TFE). In some exemplary embodiments, however, the encapsulation layer ECL may include only the inorganic layer or only the organic layer. The display panel DP may include an encapsulation substrate and a sealant, rather than the encapsulation layer ECL. The encapsulation substrate may be coupled to the display element layer LEL by the sealant.

As shown in FIGS. 2A and 2B, the display panel DP may include three areas. In particular, the display panel DP may include a first non-bending area NBA1 (or a flat area), a bending area BA configured to be bent with respect to the first non-bending area NBA1, and a second non-bending area NBA2 (or an opposite area) extending from the bending area BA. In a bent state, the second non-bending area NBA2 may face the first non-bending area NBA1. The bending area BA has a predetermined curvature in the bent state.

The base layer BL and the circuit element layer CL may be disposed to correspond to the first and second non-bending areas NBA1 and NBA2 and the bending area BA. The display element layer LEL and the encapsulation layer ECL may be disposed at least in the first non-bending area NBA1.

The shape of the display panel DP when viewed in a plan view will be described in more detail based on its unfolded state. A width in the first direction DR1 of the display panel DP, e.g., a width in a direction substantially parallel to a bending axis BX (referring to FIGS. 2C and 2D), may vary depending on an area. The bending area BA may have a width smaller than that of the first non-bending area NBA1. Since the bending area BA has a relatively small width, the bending area BA may be easily bent.

The bending area BA includes an area, in which a width thereof in the first direction DR1 gradually decreases as a distance from the first non-bending area NBA1 increases. In some exemplary embodiments, however, the width of the bending area BA may be uniform.

Referring to FIGS. 2A and 2B, the protective film PF is disposed on a lower surface of the display panel DP. In the illustrated exemplary embodiment, the protective film PF may include a first protective film PF1 and a second protective film PF2, which are disposed to be spaced apart from each other.

The protective film PF may include a synthetic resin film as its base film. The protective film PF may include the synthetic resin film including at least one of polyethersulphone (PES), polyacrylate (PAR), polyetherimide (PEI), polyethyelene napthalate (PEN), polyethyelene terephtalate (PET), polyphenylene sulfide (PPS), polyallylate, polyimide (PI), polycarbonate (PC), poly(aryleneether sulfone), and combinations thereof.

The material for the protective film PF is not particularly limited to plastic resins, and may include an organic/inorganic composite material in some exemplary embodiments. For example, the protective film PF may include a porous organic layer and an inorganic material filled in pores of the porous organic layer.

The display panel DP and the protective film PF may be coupled to each other by an adhesive member AM4 (hereinafter, referred to as a "fourth adhesive member"). The fourth adhesive member AM4 may include a first adhesive portion AM4-1 and a second adhesive portion AM4-2, which respectively correspond to the first protective film PF1 and the second protective film PF2.

As shown in FIG. 2A, the driving control module DCM may include a first circuit board MCB (or a driving circuit board), a second circuit board FCB connecting the first circuit board MCB to the display panel DP, and a driving chip F-IC mounted on the second circuit board FCB. In some exemplary embodiments, a plurality of passive devices and a plurality of active devices may be mounted on the first circuit board MCB. The first circuit board MCB may be a rigid circuit board or a flexible circuit board, and the second circuit board FCB may be a flexible circuit board.

In some exemplary embodiments, the driving chip F-IC may be omitted from the driving control module DCM. In this case, the driving control module DCM may be mounted on the display panel DP.

In the illustrated exemplary embodiment, a driving chip of the input sensing panel ISP may be mounted on the first circuit board MCB. The connection circuit boards FCB1, FCB2, and FCB3 may be connected to the first circuit board MCB. In addition, the first circuit board MCB may be electrically connected to other electronic modules via an electronic component connector.

The lower member LM may be disposed on a lower surface of the protective film PF, and may include a supporting panel or a pressure sensing sensor. The supporting panel is disposed on the lower surface of the protective film PF to support the display panel DP and the protective film PF. The supporting panel may be a metal plate having rigidity greater than a reference value. The supporting panel may be a stainless steel plate, for example. The supporting panel may have a black color to block an external light traveling to the display panel DP.

The pressure sensing sensor may sense an external pressure applied to the display module. The pressure sensing sensor may include a base layer, piezoelectric elements, and signal lines connected to the piezoelectric elements.

Referring to FIGS. 2A and 2B, the display module DM may further include the stress control film SCF disposed on the circuit element layer to correspond to at least the bending area BA. About 50% or more of a total area of the stress control film SCF may be disposed in the bending area BA. A portion of the stress control film SCF may overlap with the first non-bending area NBA1 and the second non-bending area NBA2. The stress control film SCF may include a synthetic resin film. One of the synthetic resin films for the above-mentioned protective film PF may be applied to the stress control film SCF.

The stress control film SCF may be coupled to the display panel DP by an adhesive, or may be formed by coating a synthetic resin on the display panel DP and curing the synthetic resin.

FIGS. 2C and 2D exemplarily show cross-sections of the electronic device ED, intersecting the first connection circuit board FCB1 and the second connection circuit board FCB2, and corresponding to a cutting plane substantially parallel to the second directional axis DR2. The first connection substrate FCB1 is coupled to a front surface of the input sensing panel ISP, and the second connection substrate FCB2 is coupled to a rear surface of the input sensing panel ISP.

As shown in FIGS. 2C and 2D, an adhesive member AM1 is disposed between the input sensing panel ISP and the window WM, an adhesive member AM2 is disposed between the input sensing panel ISP and the optical sheet LS, an adhesive member AM3 is disposed between the optical sheet LS and the display panel DP, the adhesive member AM4 is disposed between the display panel DP and the protective film PF, and an adhesive member AM5 is disposed between the protective film PF and the lower member LM. In addition, an adhesive member AM6 is disposed between the second protective film PF2 and the lower member LM, and an adhesive member AM7 is further disposed between the first circuit board MCB and the lower member LM.

The adhesive member AM6 may serve as a spacer that maintains a radius of curvature and a gap between the second protective film PF2 and the lower member LM. Most area of the stress control film SCF forms the curvature together with the bending area BA of the display panel DP with respect to the bending axis BX.

Figure 3A:
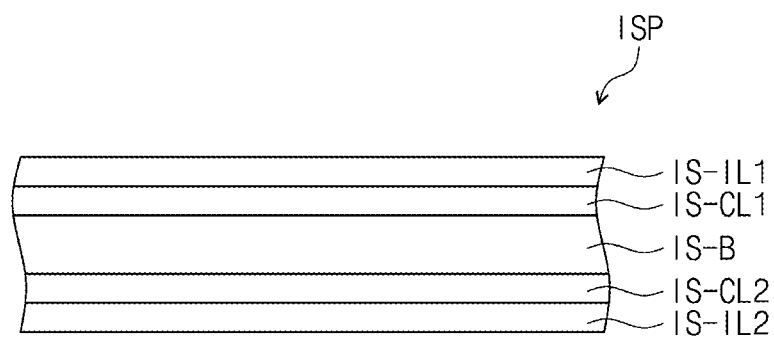
FIG. 3A is a cross-sectional view showing an input sensing panel according to an exemplary embodiment.
Figure 3B:
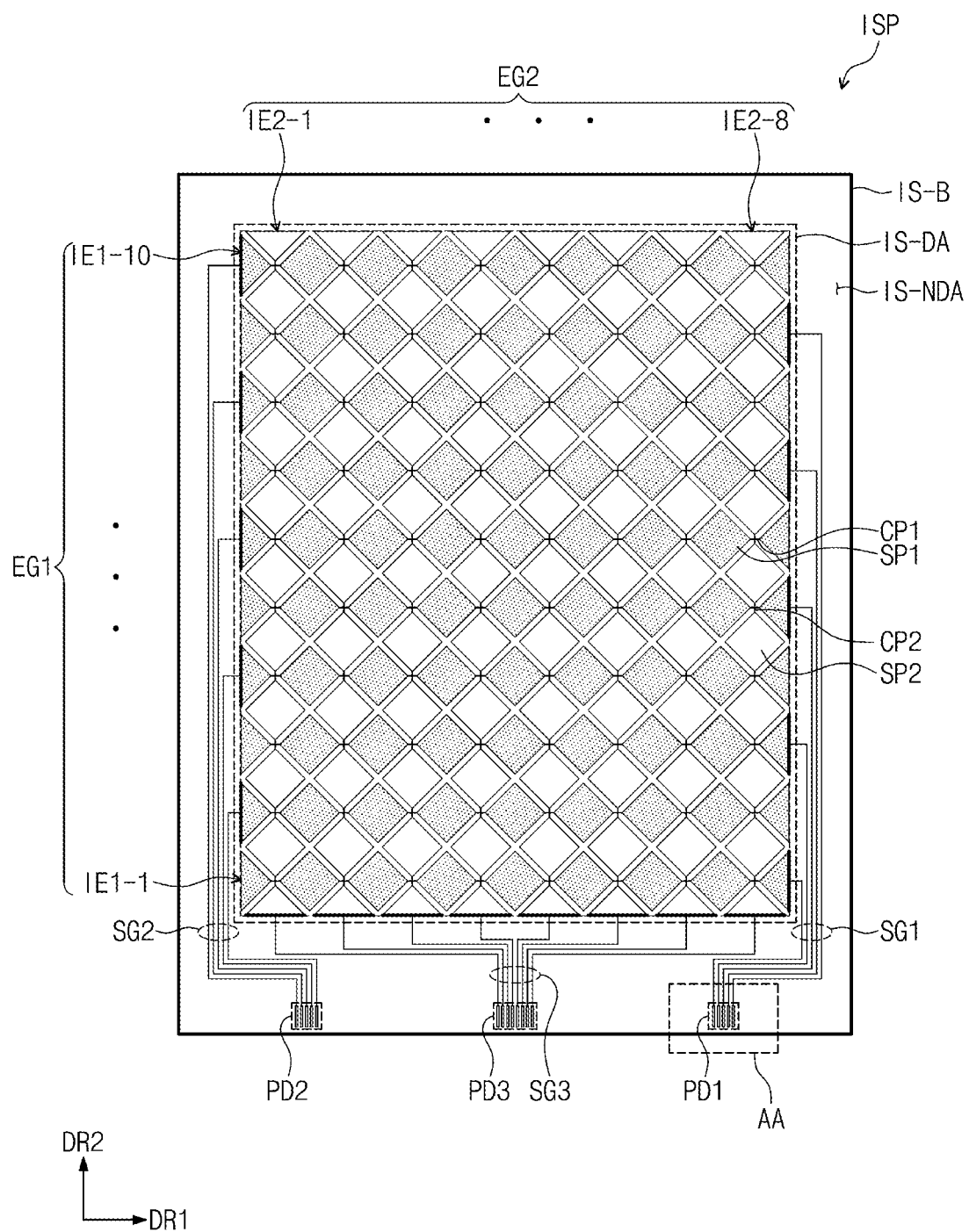
FIG. 3B is a plan view showing an input sensing panel according to an exemplary embodiment.
Figure 3C:
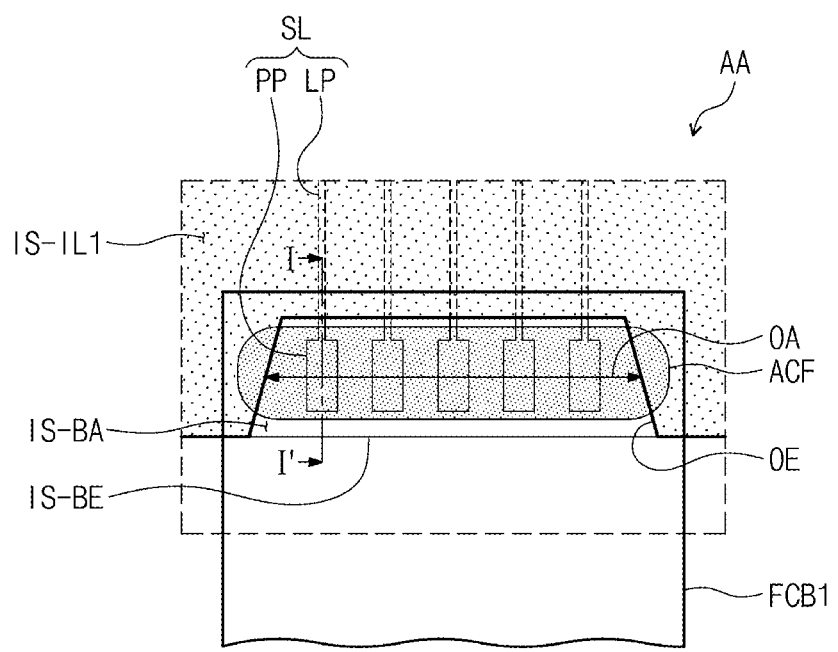
FIG. 3C is an enlarged plan view showing a bonding area of an input sensing panel according to an exemplary embodiment.

FIG. 3A is a cross-sectional view showing the input sensing panel ISP according to an exemplary embodiment. FIG. 3B is a plan view showing the input sensing panel ISP according to an exemplary embodiment. FIG. 3C is an enlarged plan view showing a bonding area AA of the input sensing panel ISP according to an exemplary embodiment. FIGS. 3D to 3G are cross-sectional views showing input sensing panels ISP according to exemplary embodiments. FIG. 3H is an enlarged plan view showing the bonding area of the input sensing panel ISP according to an exemplary embodiment.

Referring to FIG. 3A, the input sensing panel ISP may include a base layer IS-B, a first conductive layer IS-CL1, a first insulating layer IS-IL1, a second conductive layer IS-CL2, and a second insulating layer IS-IL2. The first conductive layer IS-CL1 and the first insulating layer IS-IL1 may be disposed on one surface of the base layer IS-B, and the second conductive layer IS-CL2 and the second insulating layer IS-IL2 may be disposed on another surface of the base layer IS-B.

The base layer IS-B may include a glass substrate or a synthetic resin film. Each of the first conductive layer IS-CL1 and the second conductive layer IS-CL2 may have a single-layer structure, or may have a multi-layer structure of layers stacked along the third directional axis DR3. The multi-layered conductive layer may include at least two layers among transparent conductive layers and metal layers. The multi-layered conductive layer may include the metal layers including different metal materials from each other. The transparent conductive layer may include indium tin oxide (ITO), indium zinc oxide (IZO), zinc oxide (ZnO), indium tin zinc oxide (ITZO), PEDOT, a metal nanowire, or graphene. The metal layer may include molybdenum, silver, titanium, copper, aluminum, and alloys thereof. For example, each of the first conductive layer IS-CL1 and the second conductive layer IS-CL2 may have a two-layer structure of ITO/copper. As another example, each of the first conductive layer IS-CL1 and the second conductive layer IS-CL2 may have a three-layer structure of titanium/aluminum/titanium.

Each of the first conductive layer IS-CL1 and the second conductive layer IS-CL2 may include a plurality of conductive patterns. Hereinafter, the first conductive layer IS-CL1 will be described as including first conductive patterns, and the second conductive layer IS-CL2 will be described as including second conductive patterns. Each of the first conductive patterns and the second conductive patterns may include input sensing electrodes and signal lines connected to the input sensing electrodes.

Each of the first insulating layer IS-IL1 and the second insulating layer IS-IL2 may include an inorganic layer and/or an organic layer. The inorganic layer may include at least one of aluminum oxide, titanium oxide, silicon oxide, silicon oxynitride, zirconium oxide, and a hafnium oxide. The organic layer may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin. In the illustrated exemplary embodiment, each of the first insulating layer IS-IL1 and the second insulating layer IS-IL2 may be an organic layer, however, the inventive concepts are not limited thereto.

As shown in FIG. 3B, the input sensing panel ISP may include a sensing area IS-DA and a line area IS-NDA, which respectively correspond to the display area DA (refer to FIG. 1) and the non-display area NDA (refer to FIG. 1). A size and a shape of the sensing area IS-DA may match or may be different from those of the display area DA (refer to FIG. 1).

The input sensing panel ISP may include a first electrode group EG1, a second electrode group EG2, a first signal line group SG1 connected to a portion of the first electrode group EG1, a second signal line group SG2 connected to the other portion of the first electrode group EG1, and a third signal line group SG3 connected to the second electrode group EG2.

According to an exemplary embodiment, among electrodes of the first electrode group EG1, odd-numbered electrodes may be connected to the first signal line group SG1, and even-numbered electrodes may be connected to the second signal line group SG2. Each of the electrodes of the first electrode group EG1 includes a plurality of first sensor portions SP1 and a plurality of first connection portions CP1. Each of the electrodes of the second electrode group EG2 includes a plurality of second sensor portions SP2 and a plurality of second connection portions CP2. The shapes of the electrodes of the first electrode group EG1 and the electrodes of the second electrode group EG2 are not particularly limited.

The first electrode group EG1, the first signal line group SG1, and the second signal line group SG2 may be formed from the first conductive layer IS-CL1 of FIG. 3A. The second electrode group EG2 and the third signal line group SG3 may be formed from the second conductive layer IS-CL2 of FIG. 3A. More particularly, the first electrode group EG1, the first signal line group SG1, and the second signal line group SG2 may be disposed on a different layer from the second electrode group EG2 and the third signal line group SG3.

The electrode groups and the corresponding signal line groups may have different stacked structures from each other. For example, the electrode groups may include the transparent conductive layer having the single-layer structure of ITO, and the signal line groups may include the transparent conductive layer and the metal layer disposed on the transparent conductive layer.

First to third pads PD1 to PD3 shown in FIG. 3B may include end portions of the signal lines of the first signal line group SG1 to the third signal line group SG3. The first to third pads PD1 to PD3 may further include conductive patterns formed on the end portions of the signal lines by additional processes.

As shown in FIGS. 2A, 2C, and 2D, the first and third connection circuit boards FCB1 and FCB3 are connected to an upper surface of the input sensing panel ISP. The first and third connection circuit boards FCB1 and FCB3 may be connected to the first pads PD1 and the second pads PD2 of FIG. 3B. In some exemplary embodiments, the first and third connection circuit boards FCB1 and FCB3 may be replaced with one connection circuit board connected to the first pads PD1 and the second pads PD2.

The second connection circuit board FCB2 is connected to a lower surface of the input sensing panel ISP. The second connection circuit board FCB2 may be connected to the third pads PD3 of FIG. 3B. A position (front or bottom connection position) of the bonding area of the input sensing panel ISP may be determined depending on the position of the first to third pads PD1 to PD3 with respect to the base layer IS-B. In the illustrated exemplary embodiment, three bonding areas are spaced apart from each other when viewed in a plan view.

Figure 3D:
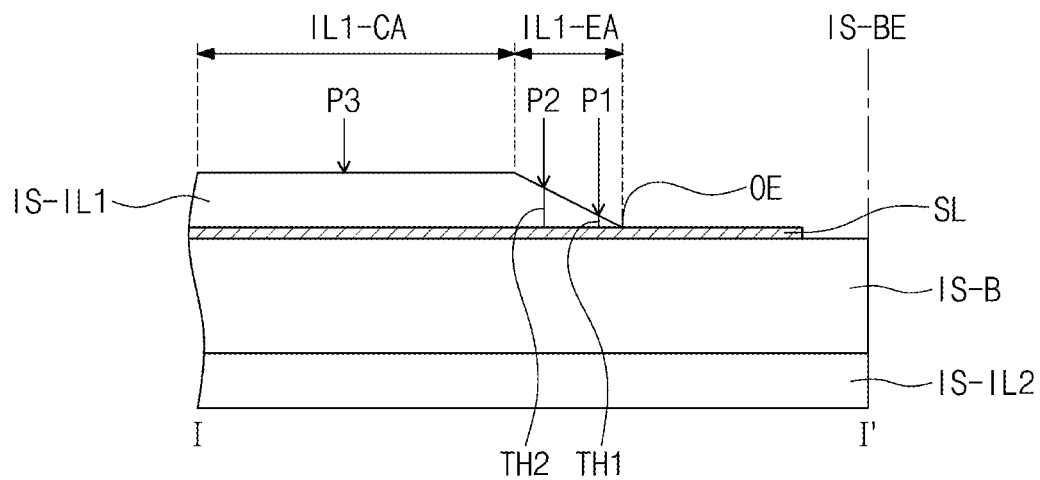
FIGS. 3D, 3E, 3F, and 3G are cross-sectional views showing an input sensing panel according to exemplary embodiments.

FIG. 3C shows the bonding area AA having the shape shown in FIGS. 2A and 3B, and FIG. 3D shows the bonding area AA having the shape shown in FIG. 3B.

Referring to FIGS. 3C and 3D, an end portion PP of each of signal lines SL is exposed without being covered by the first insulating layer IS-ILL In the illustrated exemplary embodiment, the end portion PP and a line portion LP of the signal line SL have different line widths from each other to be distinguished from each other, however, the inventive concepts are not limited thereto. In some exemplary embodiments, the line width of the signal line SL may be substantially constant. In the illustrated exemplary embodiment, the end portion PP of the signal line SL corresponds to the pad PD1 shown in FIG. 3B.

An open area OA is defined in the first insulating layer IS-IL1 to expose some areas IS-BA of the base layer IS-B when viewed in a plan view. An open edge OE corresponds to a portion of an edge of the first insulating layer IS-IL1 that defines the open area OA. The open area OA extends to an edge IS-BE of the base layer IS-B when viewed in a plan view. The open edge OE makes contact with the signal line SL. As will be described in more detail later, an edge area IL1-EA makes contact with the base layer IS-B.

In the illustrated exemplary embodiment, the first connection circuit board FCB1 may completely cover the open area OA when viewed in a plan view. An anisotropic conductive material ACF electrically connects the end portion PP of the signal lines SL exposed to the outside to the pad of the first connection circuit board FCB1. Pads of the signal lines are disposed in the first connection circuit board FCB1 to correspond to the end portions PP of the signal lines SL.

Referring to FIG. 3D, a first thickness TH1 of the first insulating layer IS-IL1, which is measured at a first point P1 spaced apart from the open edge OE, is less than a second thickness TH2 of the first insulating layer IS-IL1, which is measured at a second point P2 farther from the open edge OE than the first point P1. Distances of the first point P1 and the second point P2 from the open edge OE are measured in the second direction DR2.

The first point P1 and the second point P2 may be disposed in the edge area IL1-EA of the first insulating layer IS-ILL The edge area IL1-EA is defined along the open edge OE, and the thickness of the first insulating layer IS-IL1 varies along the second direction DR2 in the edge area IL1-EA. For example, a thickness of the edge area IL1-EA may gradually decrease as a distance to the open edge OE decreases in the second direction DR2. As such, the thickness of the first insulating layer IS-IL1 gradually decreases from the second point P2 to the open edge OE.

An area in which the thickness of the first insulating layer IS-IL1 does not vary in the second direction DR2 may be defined as a cover area IL1-CA. A third point P3 farther from the open edge OE than the second point P2 may be disposed in the cover area IL1-CA of the first insulating layer IS-IL1.

Figure 3E:
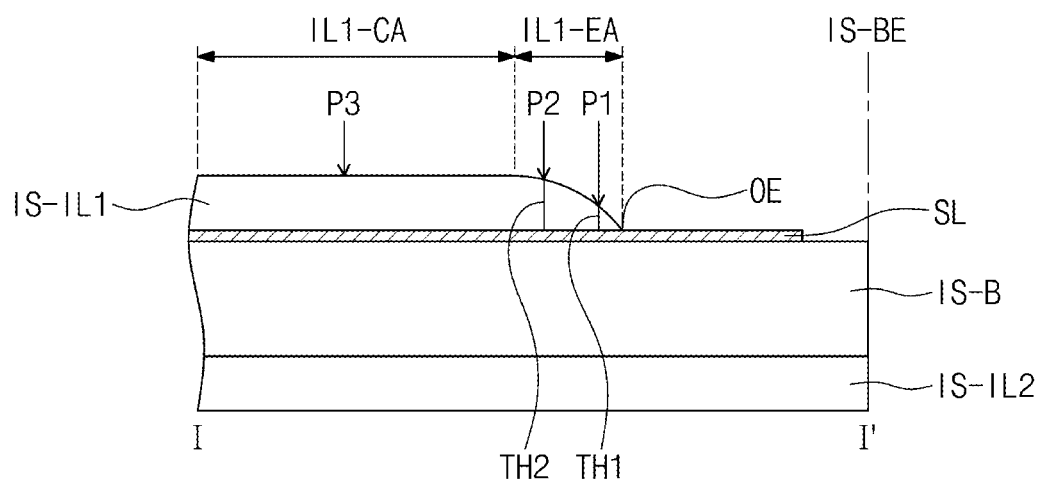
Figure 3F:
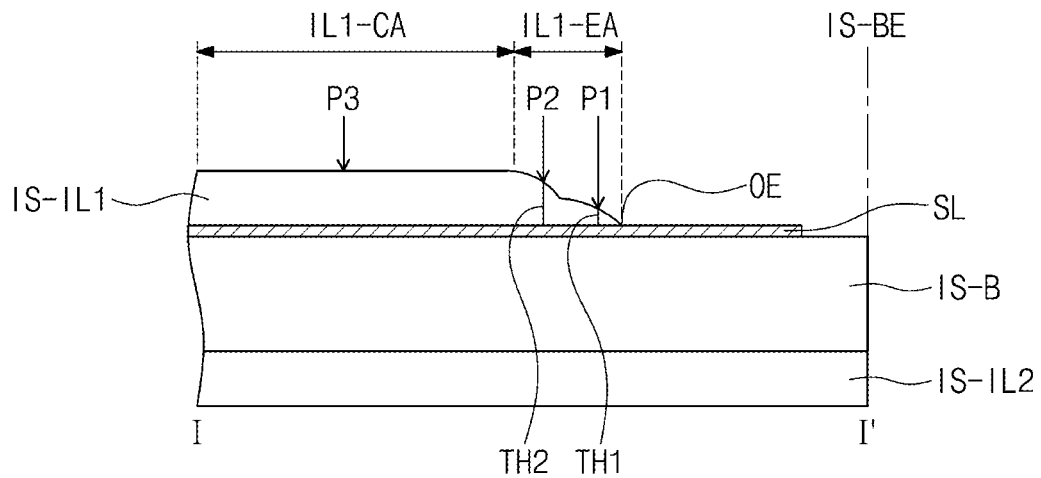

FIGS. 3E and 3F show first insulating layers IS-IL1 according to exemplary embodiments, each of which has a different cross-section from that of FIG. 3D. The first insulating layers IS-IL1 shown in FIGS. 3E and 3F also have a varying thickness from the first point P1 to the third point P3. As shown in FIG. 3E, an edge area IL1-EA of the first insulating layer IS-IL1 according to the illustrated exemplary embodiment may have a curved line profile. As shown in FIG. 3F, an edge area IL1-EA of the first insulating layer IS-IL1 according to the illustrated exemplary embodiment may have a curved line profile with an inflection point.

Figure 3G:
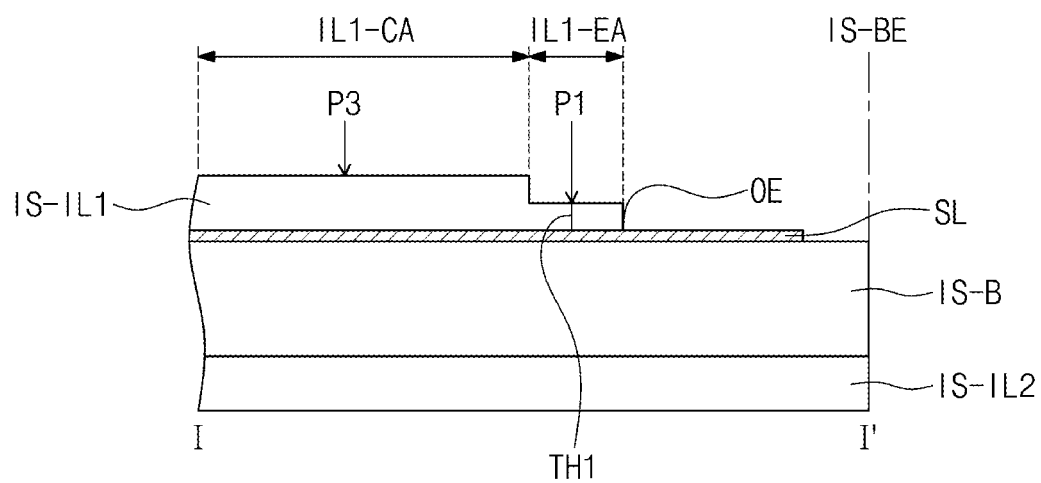
Figure 3H:
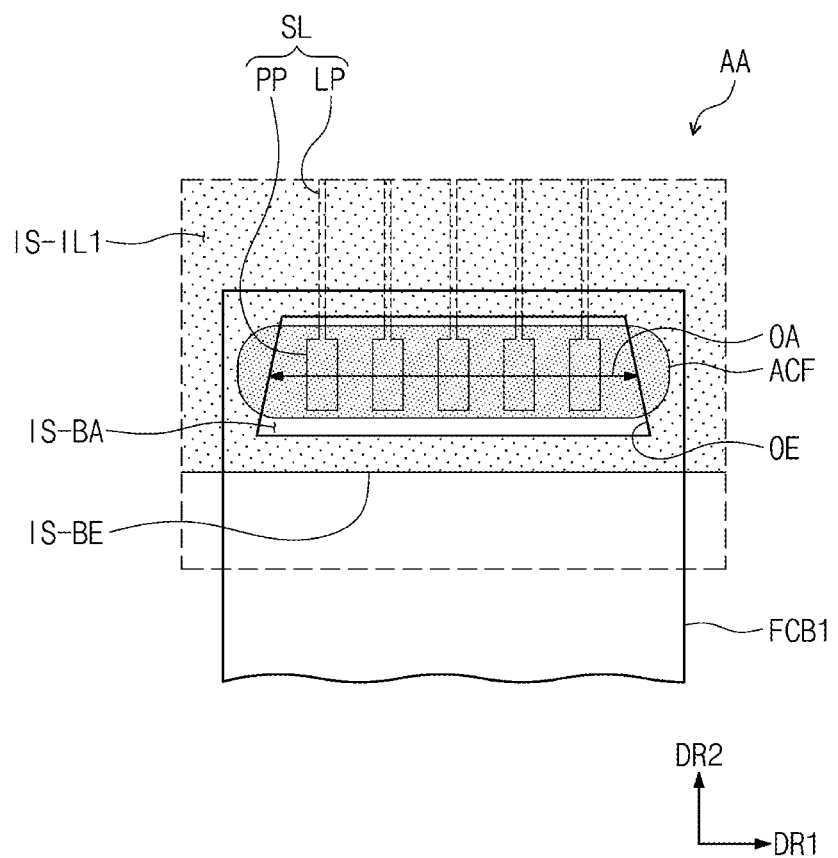
FIG. 3H is an enlarged plan view showing a bonding area of an input sensing panel according to an exemplary embodiment.

Referring to FIG. 3G, the first insulating layer IS-IL1 disposed in an edge area IL1-EA has a thickness less than that in a cover area IL1-CA. As such, a step difference is defined between the third point P3 and the first point P1. The step difference may be formed by two insulating layers. Two insulating layers may be disposed in the cover area IL1-CA, and one insulating layer may be disposed in the edge area IL1-EA. The step differences may be formed in a stepwise manner toward the open edge OE in the edge area IL1-EA.

FIGS. 3C to 3G show the bonding area AA of the first pad PD1, however, the above-mentioned features may be equally applied to a bonding area of the second pad PD2 and a bonding area of the third pad PD3. For example, the bonding area of the second pad PD2 may be substantially the same as the bonding area AA of the first pad PD1.

The bonding area of the third pad PD3 may be substantially the same as a shape obtained by turning the bonding area AA of the first pad PD1 upside down. In particularly, a cross-section shape of the bonding area of the third pad PD3 may be substantially the same as shapes obtained by turning the cross-sections shown in FIGS. 3D to 3G upside down.

Two points having the same condition as the first point P1 and the second point P2 of the first insulating layer IS-IL1 may be defined in the second insulating layer IS-IL2. Referring to FIGS. 3B and 3C, two open areas OA are defined in the first insulating layer IS-IL1, and one open area is defined in the second insulating layer IS-IL2. The three open areas OA do not overlap with each other when viewed in a plan view.

As shown in FIG. 3H, the open edge OE may form a closed line when viewed in a plan view. The cross-sectional shape of the first insulating layer IS-IL1 taken along one direction with respect to the open edge OE may be substantially the same as one of the shapes shown in FIGS. 3D to 3G.

Figure 4A:
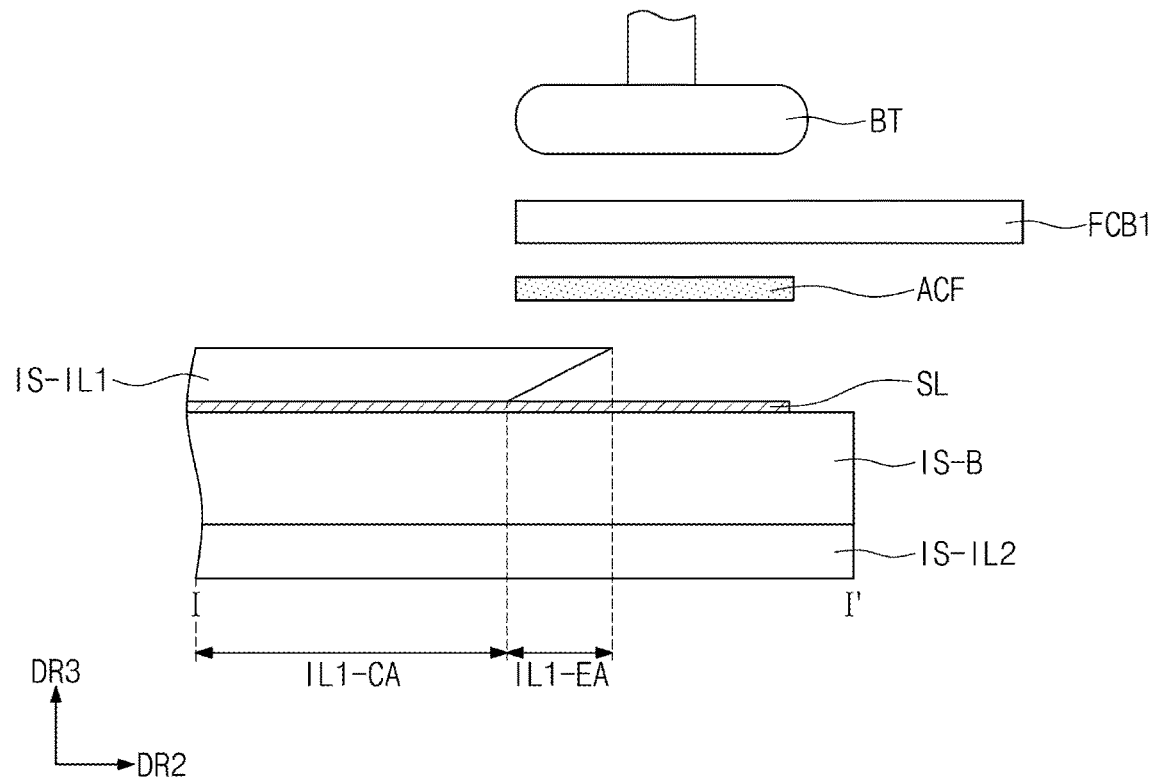
FIGS. 4A and 4B are cross-sectional views showing a bonding process of an electronic device according to a comparative embodiment.
Figure 4B:
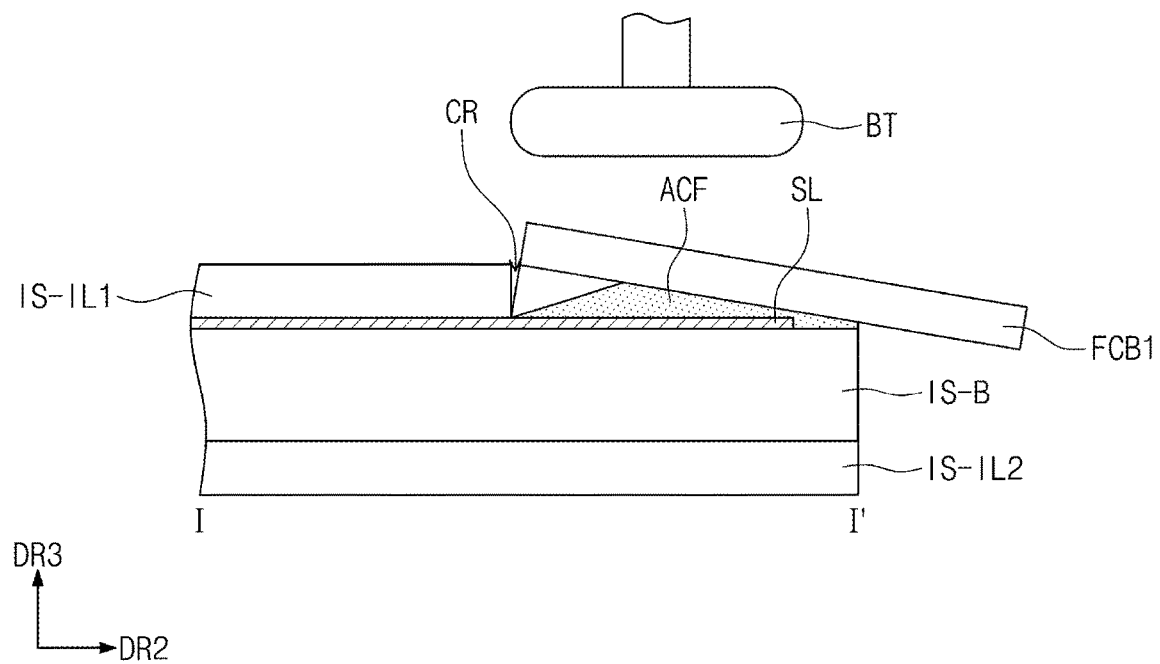
Figure 4C:
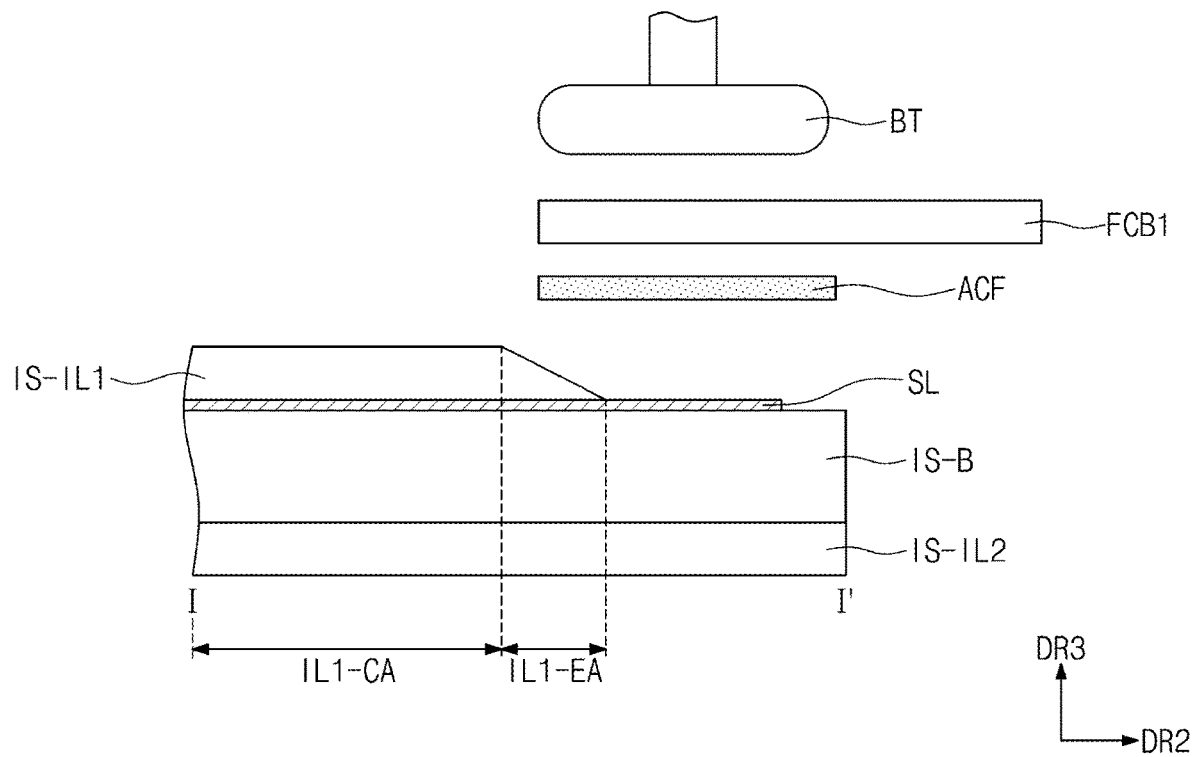
FIGS. 4C and 4D are cross-sectional views showing a bonding process of an electronic device according to an exemplary embodiment.
Figure 4D:
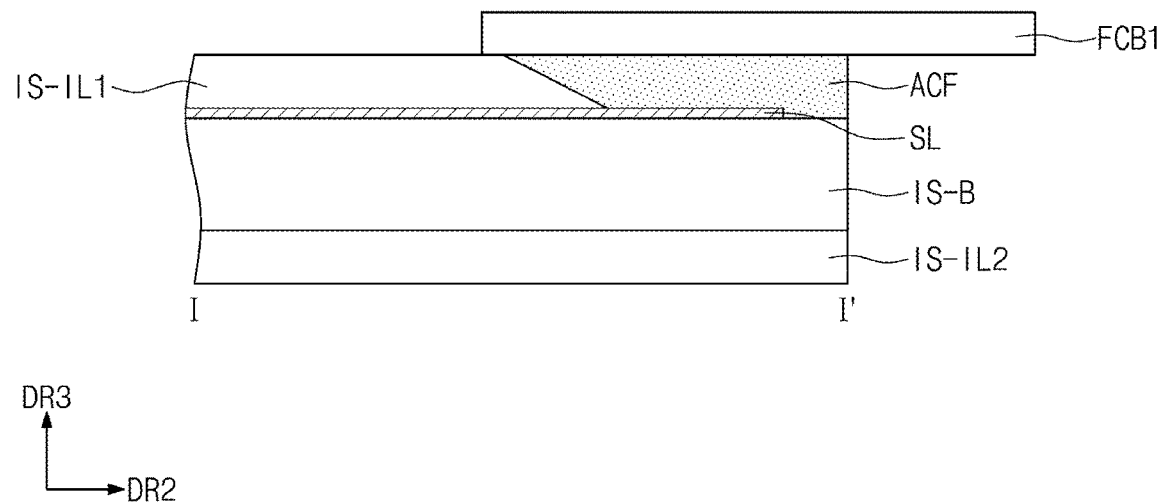

FIGS. 4A and 4B are cross-sectional views showing a bonding process of an electronic device according to a comparative embodiment. FIGS. 4C and 4D are cross-sectional views showing a bonding process of an electronic device according to an exemplary embodiment. FIGS. 4C and 4D exemplarily show the insulating layer of FIG. 3D.

Referring to FIGS. 4A and 4B, a pressing tool BT is used in the bonding process of the input sensing panel ISP and the connection circuit board FCB1. The anisotropic conductive material ACF is disposed between the bonding area of the input sensing panel ISP and the bonding area of the connection circuit board FCB1. The anisotropic conductive material ACF may be provided after being disposed on one of the bonding area of the input sensing panel ISP and the bonding area of the connection circuit board FCB1.

According to the comparative embodiment, the edge area IL1-EA of the first insulating layer IS-IL1 may have a reverse taper shape. This is because an upper portion of the first insulating layer IS-IL1, which is covered by a mask, is relatively less developed during a patterning of the first insulating layer IS-IL1.

As the edge area IL1-EA of the first insulating layer IS-IL1 is pressed by the pressing tool BT or by the connection circuit board FCB1 in the bonding process, a crack CR may be generated in the first insulating layer IS-ILL In this case, when moisture infiltrates through the crack CR, the signal line SL may be corroded.

According to FIGS. 4C and 4D, the edge area IL1-EA of the first insulating layer IS-IL1 according to an exemplary embodiment is not directly pressed by the pressing tool BT, or is not pressed by the connection circuit board FCB1. Accordingly, the crack CR of the first insulating layer IS-IL1 may be prevented from being generated.

The upper area (e.g., some areas defined in the thickness direction) of the edge area IL1-EA of the first insulating layer IS-IL1 is developed in the process of patterning the first insulating layer IS-ILL For example, the upper area of the edge area IL1-EA of the first insulating layer IS-IL1 may be partially removed by exposing the upper area relatively less than an area of the first insulating layer IS-IL1, which is completely removed.

Figure 5A:
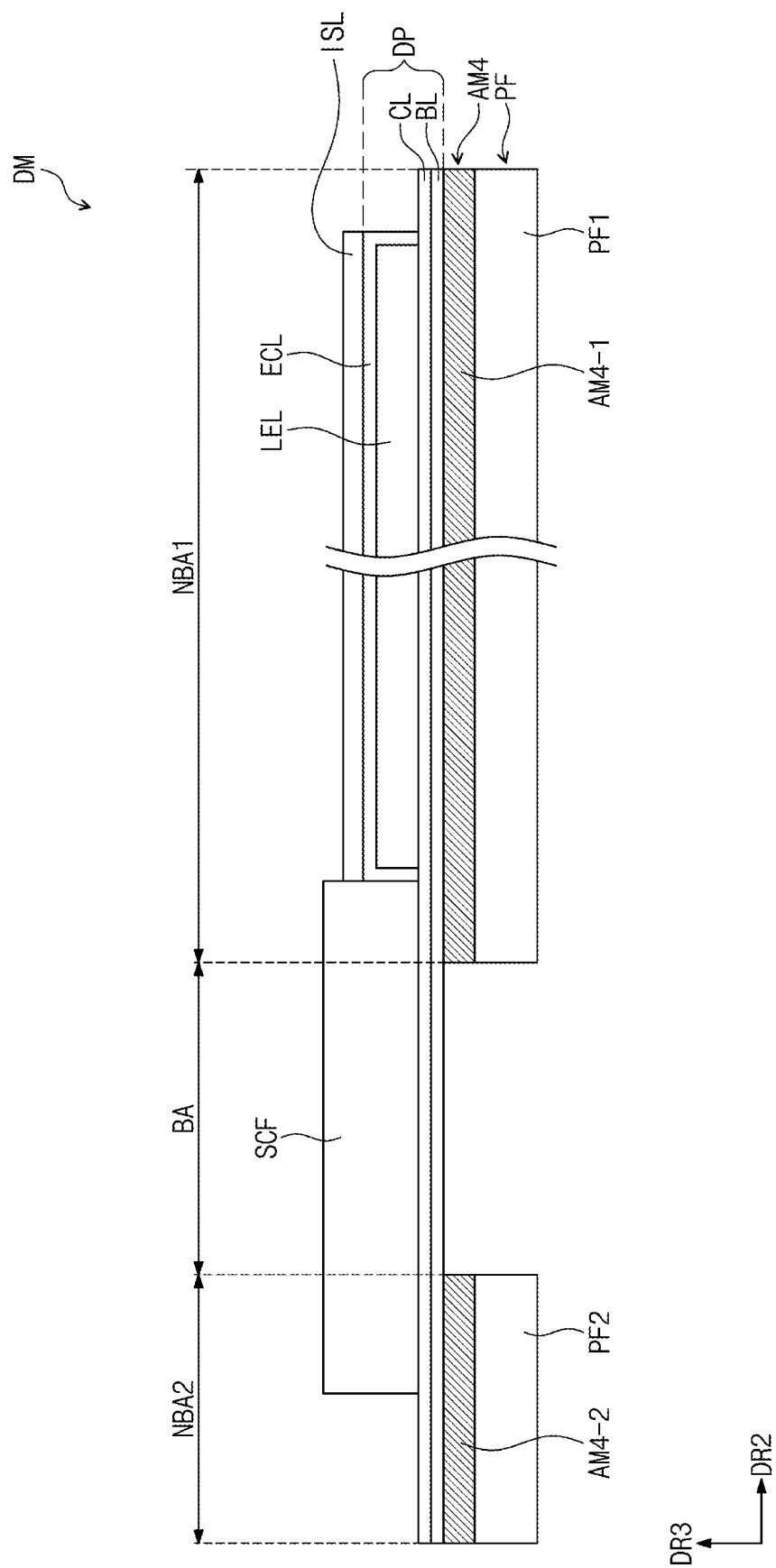
FIG. 5A is a cross-sectional view showing a display module according to an exemplary embodiment.
Figure 5B:
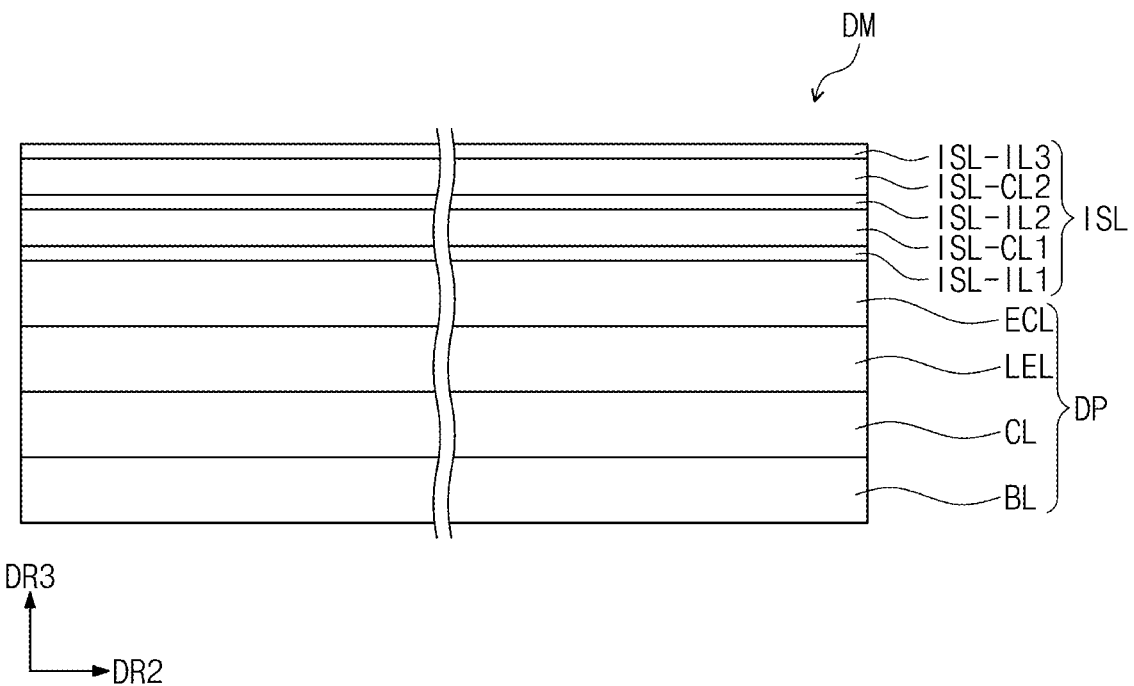
FIG. 5B is an enlarged cross-sectional view showing a display module according to an exemplary embodiment.
Figure 5C:
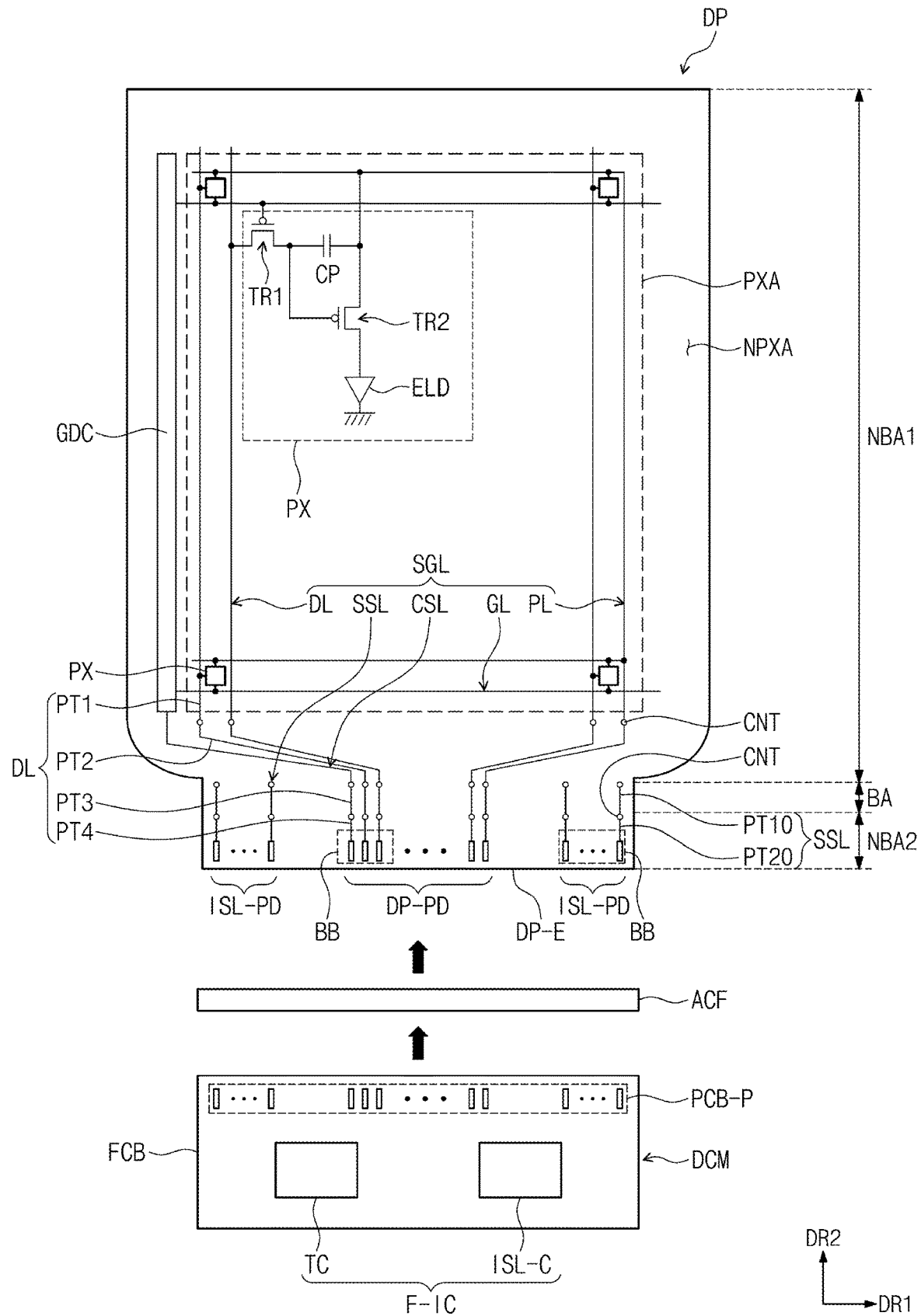
FIG. 5C is a plan view showing a display panel according to an exemplary embodiment.
Figure 5D:
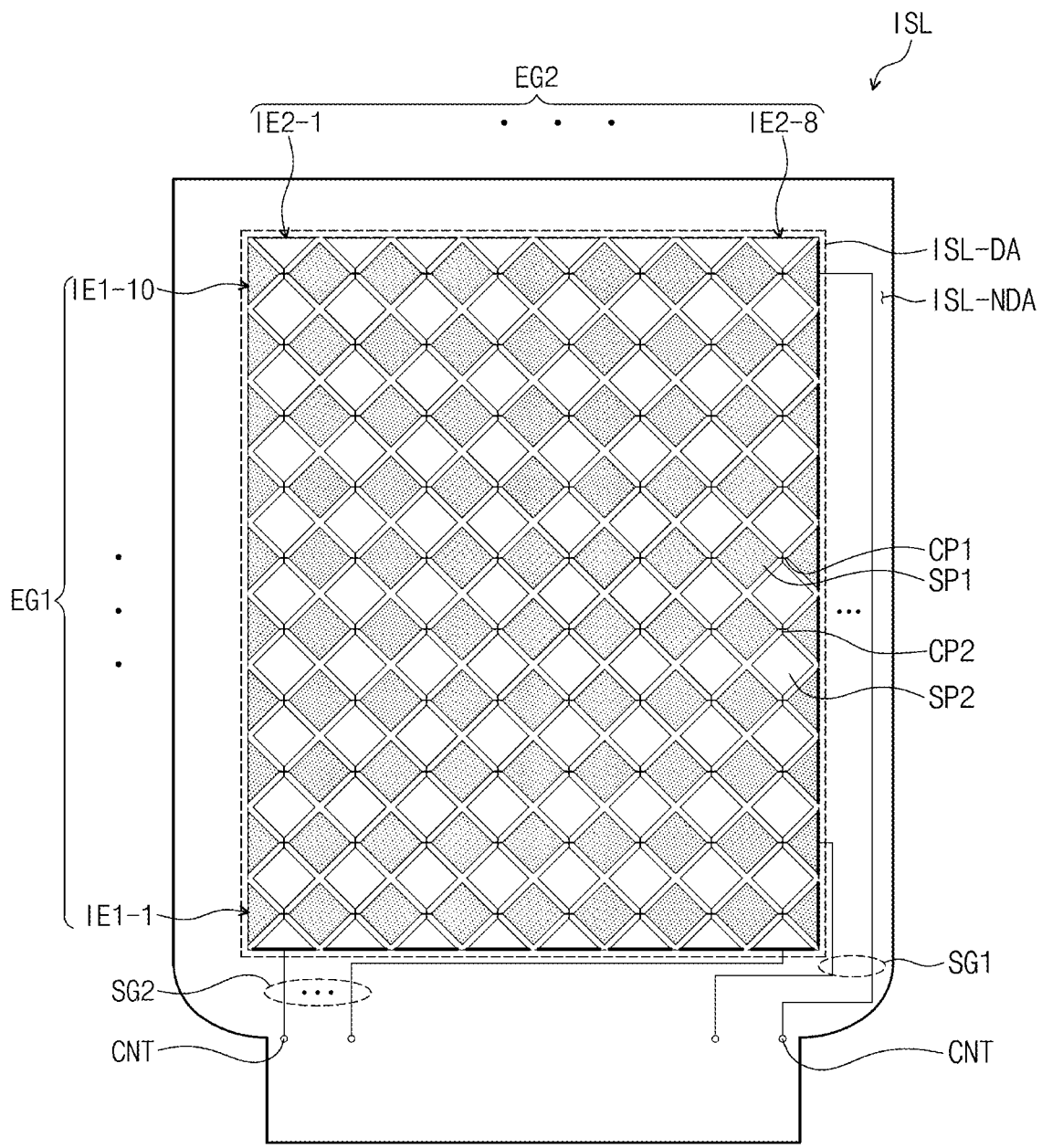
FIG. 5D is a plan view showing an input sensor according to an exemplary embodiment.

FIG. 5A is a cross-sectional view showing a display module DM according to an exemplary embodiment. FIG. 5B is an enlarged cross-sectional view showing the display module DM according to an exemplary embodiment. FIG. 5C is a plan view showing a display panel DP according to an exemplary embodiment. FIG. 5D is a plan view showing an input sensor ISL according to an exemplary embodiment.

The display module DM shown in FIG. 5A includes the display panel DP shown in FIG. 2B and the input sensor ISL directly disposed on the display panel DP. As used herein, the expression that "the input sensor ISL is directly disposed on the display panel DP" may refer that no adhesive layer is disposed between the input sensor ISL and the display panel DP. The input sensor ISL is formed on a base surface provided by the display panel DP through successive processes. Different from the above-described input sensing panel ISP (refer to FIG. 3A), according to the illustrated exemplary embodiment, the base layer IS-B (refer to FIG. 3A) may be omitted from a layered type input sensor ISL.

The display module DM of FIG. 5A is electrically connected to the driving control module DCM as shown in FIG. 2A. The display module DM and the driving control module DCM may form the electronic device ED.

As shown in FIG. 5B, the display panel DP according to the illustrated exemplary embodiment includes the base layer BL, the circuit element layer CL, the display element layer LEL, and the encapsulation layer ECL. The input sensor ISL is directly disposed on the base surface provided by the encapsulation layer ECL. The input sensor ISL may include a first insulating layer ISL-IL1, a first conductive layer ISL-CL1, a second insulating layer ISL-IL2, a second conductive layer ISL-CL2, and a third insulating layer ISL-IL3. The first insulating layer ISL-IL1 may make contact with the encapsulation layer ECL. In some exemplary embodiments, the first insulating layer ISL-IL1 may be omitted.

FIG. 5C shows the display panel DP that is partially different from the display panel DP of FIG. 2A. Hereinafter, different features of the display panel DP of FIG. 5C from the display panel DP of FIG. 2A will be mainly described. In some exemplary embodiments, the display panel DP shown in FIG. 2A may be replaced with the display panel DP shown in FIG. 5C.

A driving circuit GDC may be disposed in a non-pixel area NPXA. The driving circuit GDC may include a gate driving circuit. The gate driving circuit may generate gate signals. The gate driving circuit may include a plurality of transistors, which may be formed through the same process for forming a driving circuit of the pixels PX, e.g., a low temperature polycrystalline silicon (LTPS) process or a low temperature polycrystalline oxide (LTPO).

The signal lines SGL may further include a control signal line CSL and auxiliary signal lines SSL. The control signal line CSL may apply control signals to the gate driving circuit GDC. The auxiliary signal lines SSL may be signal lines connected to the input sensor ISL.

The signal lines SGL may include a plurality of portions disposed on different layers from each other. FIG. 5C exemplarily shows data lines DL including four portions PT1 to PT4, and the auxiliary signal lines SSL including two portions PT10 and PT20. The four portions PT1 to PT4 are connected to each other through contact holes CNT, and the two portions PT10 and PT20 are connected to each other through contact holes CNT. A first portion PT10 of the auxiliary signal lines SSL is connected to signal line groups SG1 and SG2 (refer to FIG. 5D) of the input sensor ISL, which will be described later, through the contact holes CNT. One portion PT3 of the data lines DL and one portion PT10 of the auxiliary signal lines SSL may be disposed in a bending area BA.

Different from FIG. 2A, the display panel DP and the driving control module DCM according to the illustrated exemplary embodiment are separated from each other as shown in FIG. 5C. An anisotropic conductive material ACF that electrically connects the display panel DP and the circuit board FCB is shown in FIG. 5C. A driving chip F-IC may include a timing control circuit TC and an input sensing circuit ISL-C.

As shown in FIG. 5D, the input sensor ISL includes a first electrode group EG1, a second electrode group EG2, and signal line groups connected to the first and second electrode groups EG1 and EG2. In the illustrated exemplary embodiment, the input sensor ISL is exemplarily shown as including two signal line groups SG1 and SG2. The input sensor ISL includes a sensing area ISL-DA and a line area ISL-NDA.

The signal lines of the first signal line group SG1 and the signal lines of the second signal line group SG2 may be connected to the auxiliary signal lines SSL (refer to FIG. 5C) through contact holes CNT. The contact holes CNT penetrate through the insulating layers disposed between the signal lines of the first and second signal line groups SG1 and SG2 and the auxiliary signal lines SSL.

FIGS. 5C and 5D show a plurality of pads DP-PD and ISL-PD. First pads DP-PD are connected to the pixels PX, and second pads ISL-PD are connected to the first and second electrode groups EG1 and EG2 through the auxiliary signal line SSL. The first pads DP-PD include end portions of the signal lines DL, and the second pads ISL-PD include end portions of the auxiliary signal lines SSL.

Two bonding areas BB shown in FIG. 5C may be substantially the same as each other. Hereinafter, the bonding area BB will be described in detail with reference to FIGS. 6A to 6C.

Figure 6A:
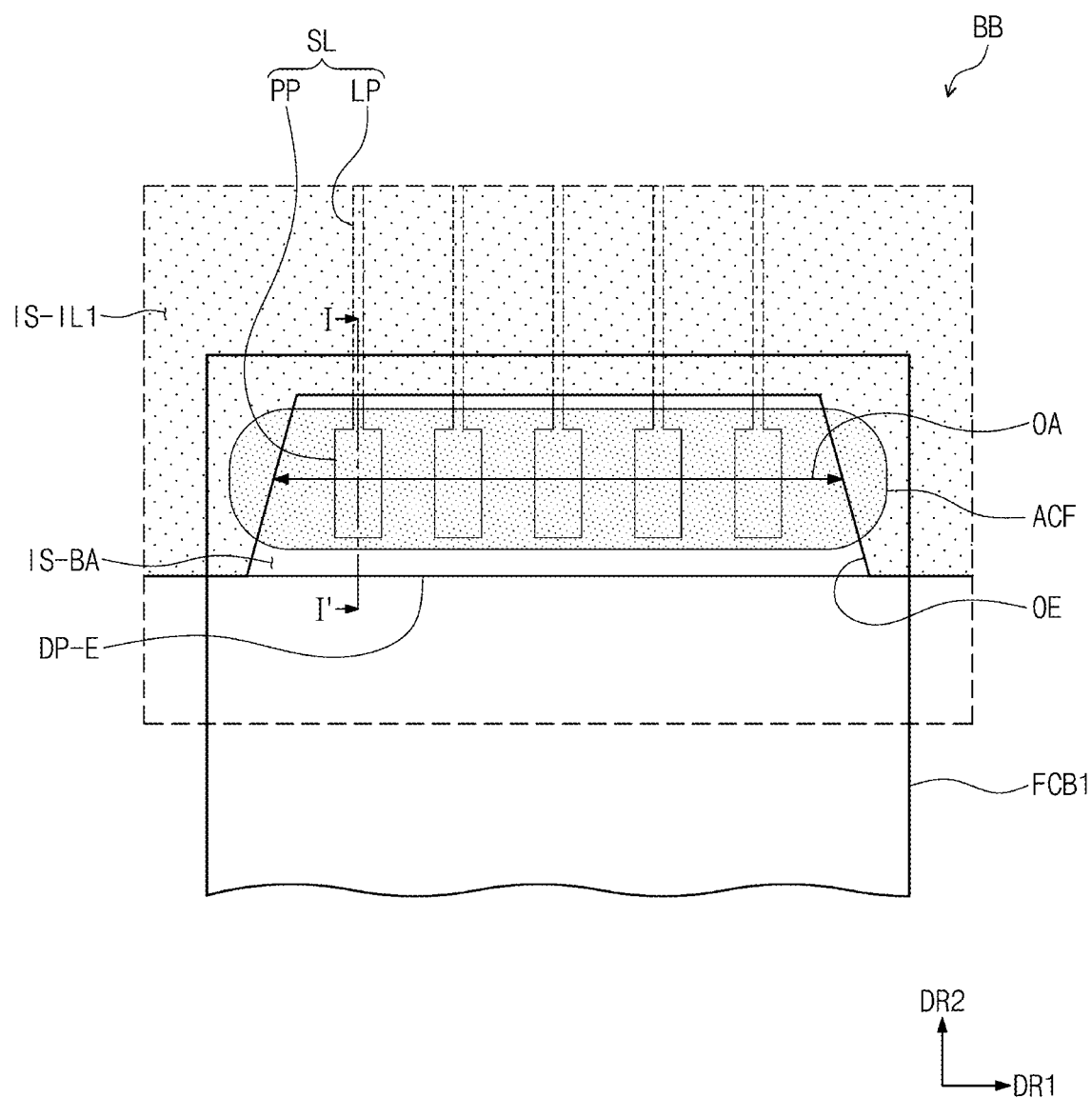
FIG. 6A is an enlarged plan view showing a bonding area of a display panel according to an exemplary embodiment.
Figure 6B:
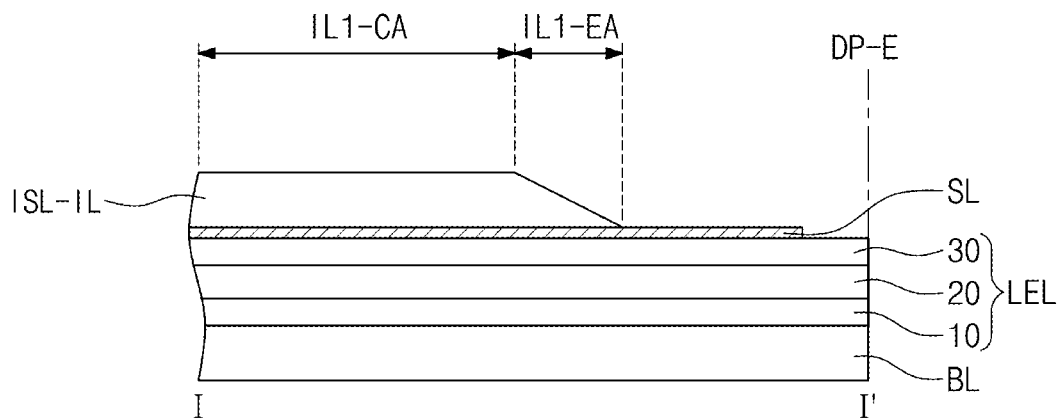
FIGS. 6B and 6C are cross-sectional views showing a bonding area of a display panel according to exemplary embodiments.
Figure 6B:
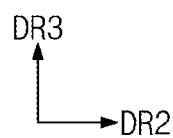
Figure 6C:
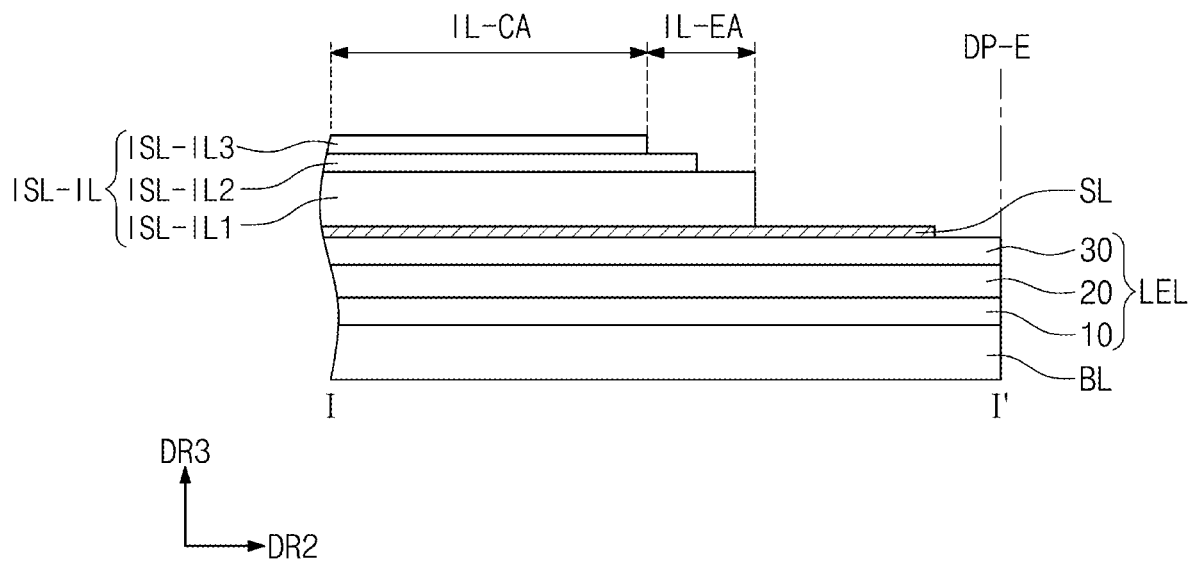
Figure 6C:
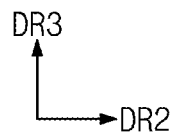

FIG. 6A is an enlarged plan view showing the bonding area BB of the display panel DP according to an exemplary embodiment. FIGS. 6B and 6C are cross-sectional views showing the bonding area BB of the display panel DP according to exemplary embodiments.

The bonding area BB shown in FIG. 6A may be substantially the same as the bonding area AA shown in FIG. 3C. FIG. 6A exemplarily shows an open area OA extending to an edge DP-E of the display panel DP.

However, a cross-sectional shape of the bonding area BB may be partially different from the bonding area of FIG. 3D. The insulating layer IS-IL1 is shown as having a shape that corresponds to that of FIG. 3D, however, the inventive concepts are not limited thereto. For example, in some exemplary embodiments, the insulating layer IS-IL1 may have a cross-sectional shape that is shown in any one of FIGS. 3E to 3G.

The signal line SL shown in FIG. 6A may be the data line DL or the auxiliary signal line SSL shown in FIG. 5C, and may be disposed on a base surface provided by the display panel DP. As shown in FIG. 6B, the signal line SL may be disposed on a plurality of insulating layers 10 to 30 of the display element layer LEL. At least one of the insulating layers 10 to 30 may overlap with the pixel area PXA and the non-pixel area NPXA shown in FIG. 5C.

An insulating layer ISL-IL that covers the signal line SL and exposes an end portion of the signal line SL may be one of the first insulating layer ISL-IL1, the second insulating layer ISL-IL2, and the third insulating layer ISL-IL3, which have been described above with reference to FIG. 5B. In the illustrated exemplary embodiment, the insulating layer ISL-IL may be the first insulating layer ISL-IL1, for example. In the illustrated exemplary embodiment, the insulating layer ISL-IL may include an organic layer.

Referring to FIGS. 5D and 6B, the insulating layer ISL-IL may make contact with the signal line SL in the line area ISL-NDA, and may make contact with one input sensing electrode of the first electrode group EG1 and the second electrode group EG2 in the sensing area ISL-DA.

Referring to FIG. 6C, according to another exemplary embodiment, an edge area IL-EA of the insulating layer ISL-IL may be formed by a step difference between the insulating layers ISL-IL1, ISL-IL2, and ISL-IL3. A cover area IL-CA may be defined as an area, in which the insulating layers ISL-IL1, ISL-IL2, and ISL-IL3 overlap with each other.

Figure 7A:
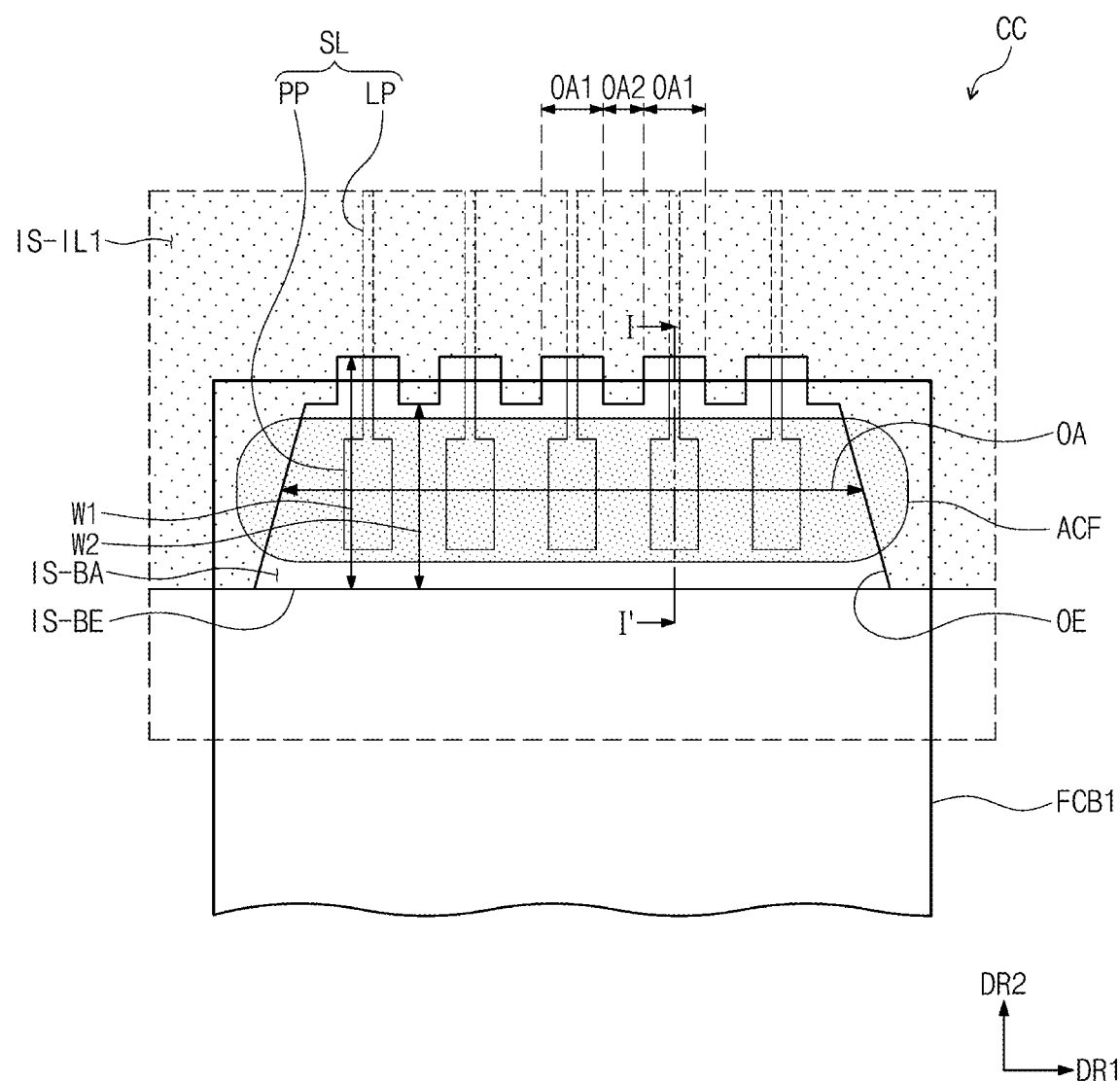
FIG. 7A is an enlarged plan view showing a bonding area of an electronic panel according to an exemplary embodiment.
Figure 7B:
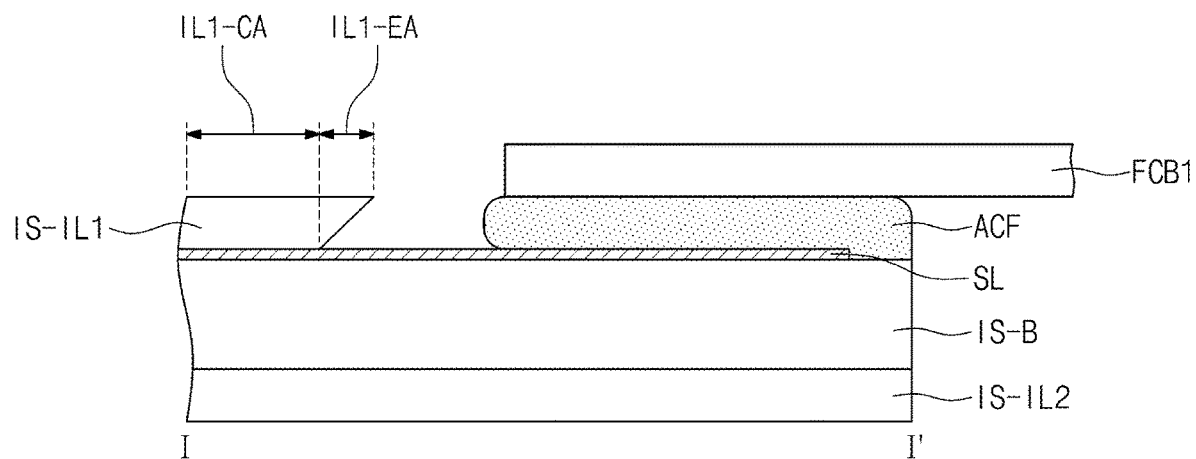
FIGS. 7B and 7C are cross-sectional views showing a bonding area of an electronic panel according to an exemplary embodiment.
Figure 7C:
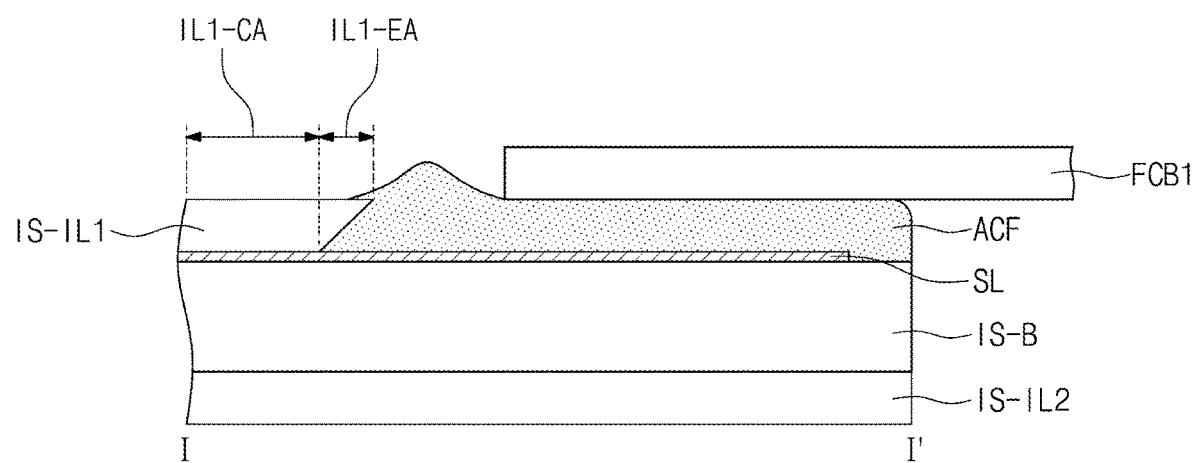
Figure 8A:
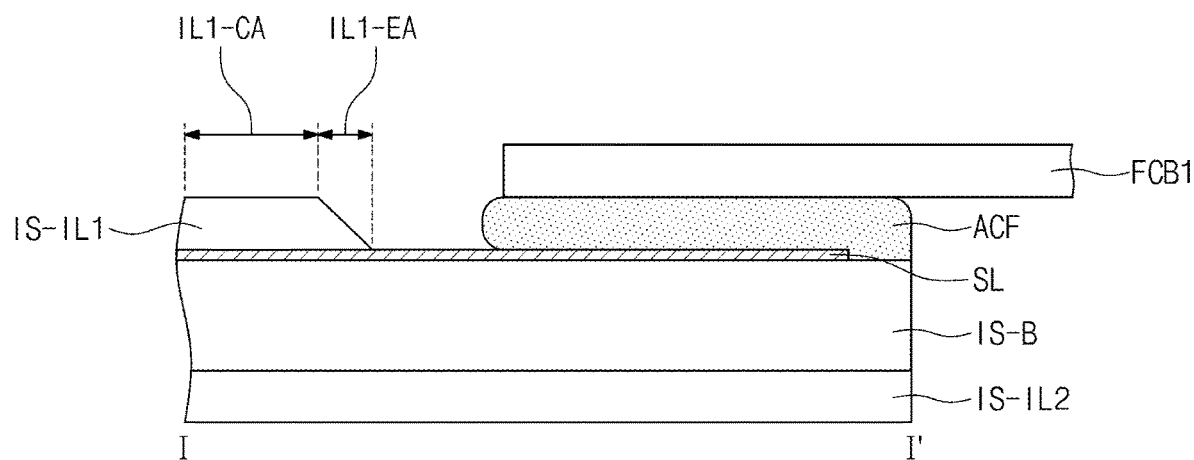
FIGS. 8A, 8B, and 8C are cross-sectional views showing a bonding area of an electronic panel according to an exemplary embodiment.
Figure 8A:
Figure 8B:
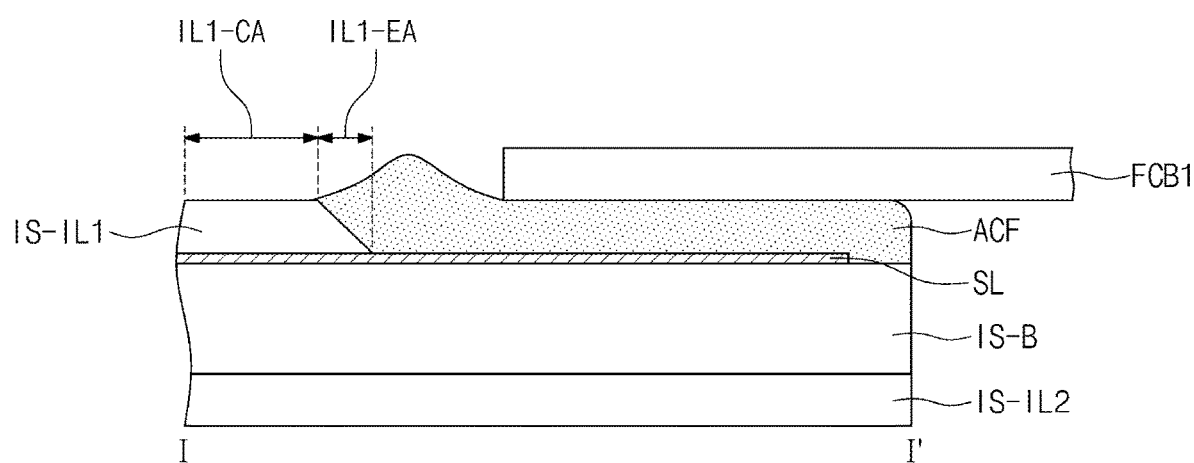
Figure 8B:
Figure 8C:
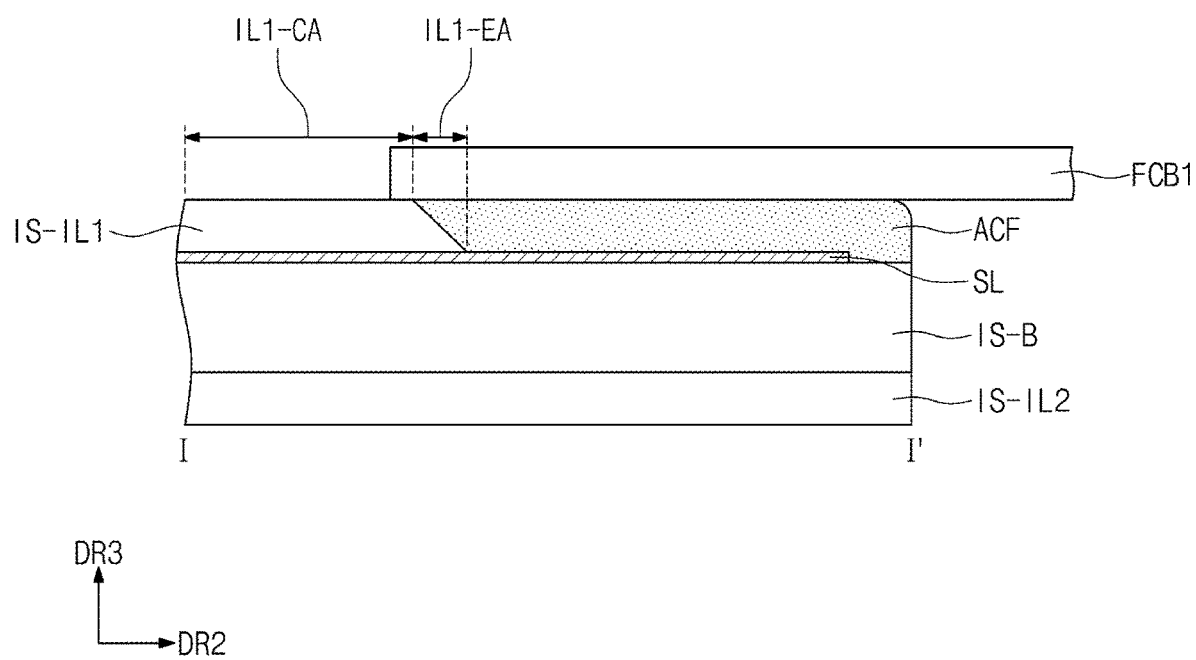

FIG. 7A is an enlarged plan view showing a bonding area CC of an electronic panel according to an exemplary embodiment. FIGS. 7B and 7C are cross-sectional views showing a bonding area CC of an electronic panel according to exemplary embodiments. FIGS. 8A to 8C are cross-sectional views showing a bonding area CC of an electronic panel according to exemplary embodiments.

The bonding area CC may be applied to one of the bonding area AA of FIG. 3B or the bonding area BB of FIG. 5C. FIGS. 7B to 8C exemplarily show the bonding area CC with respect to a cross-section corresponding to that of FIGS. 3B and 3C.

Referring to FIG. 7A, an open area OA has widths W1 and W2 depending on its area. The widths W1 and W2 are lengths in the second direction DR2 corresponding to the extension direction of the signal line SL. The widths W1 and W2 of the extended open area OA are substantially the same as lengths from an edge IS-BE of the base layer IS-B to the open edge OE. A width of the closed open area OA shown in FIG. 3H is substantially the same as a length between both points of the open edge OE, which face each other, in the second direction DR2.

The open area OA includes a first area OA1 having a first width W1 and a second area OA2 having a second width W2 less than the first width W1. The first area OA1 is provided in a plural number to correspond to the signal lines SL. The second area OA2 is disposed between two first areas OA1 adjacent to each other.

The first connection circuit board FCB1 overlaps with the first area OA1 and the second area OA2. The anisotropic conductive material ACF is disposed between the first connection circuit board FCB1 and the open area OA. The first connection circuit board FCB1 does not overlap with a portion of the first area OA1. In the bonding process described with reference to FIGS. 4A to 4D, an area applying the greatest stress to the first insulating layer IS-IL1 is an area corresponding to the edge of the first connection circuit board FCB1. In particular, the area applying the greatest stress to the first insulating layer IS-IL1 is an area overlapping with the signal line SL corresponding to the edge of the first connection circuit board FCB1. According to the illustrated exemplary embodiment, the first insulating layer IS-IL1 is not disposed in the area corresponding to the edge of the first connection circuit board FCB1. In this manner, the crack CR (referring to FIG. 4B) generated in the first insulating layer IS-IL1 during the bonding process may be prevented or at least be suppressed.

Since the signal line SL is not disposed in the second area OA2, the stress applied to the second area OA2 may be distributed by the base layer IS-B. Due to the second area OA2, an area that is non-overlapped between the first insulating layer IS-IL1 and the first connection circuit board FCB1 may be decreased.

Referring to FIGS. 7B and 7C, even though the edge area IL1-EA has the reverse taper shape, the crack in the first insulating layer IS-IL1 may be prevented since the edge area IL1-EA is not directly pressed by the first connection circuit board FCB1.

As shown in FIG. 7C, the anisotropic conductive material ACF may be disposed in a portion of the first area OA1, which does not overlap with the first connection circuit board FCB1. The anisotropic conductive material ACF may cover the portion of the signal line SL, which is exposed to the outside. The anisotropic conductive material ACF may completely cover the open area OA shown in FIG. 7A when viewed in a plan view.

Referring to FIGS. 8A to 8C, the edge area IL1-EA has the shape shown in FIG. 3D. However, in some exemplary embodiments, the edge area IL1-EA may have the cross-sectional shape shown in any one of FIGS. 3E to 3G. As shown in FIG. 8C, the first connection circuit board FCB1 may completely cover the first area OA1.

Figure 9A:
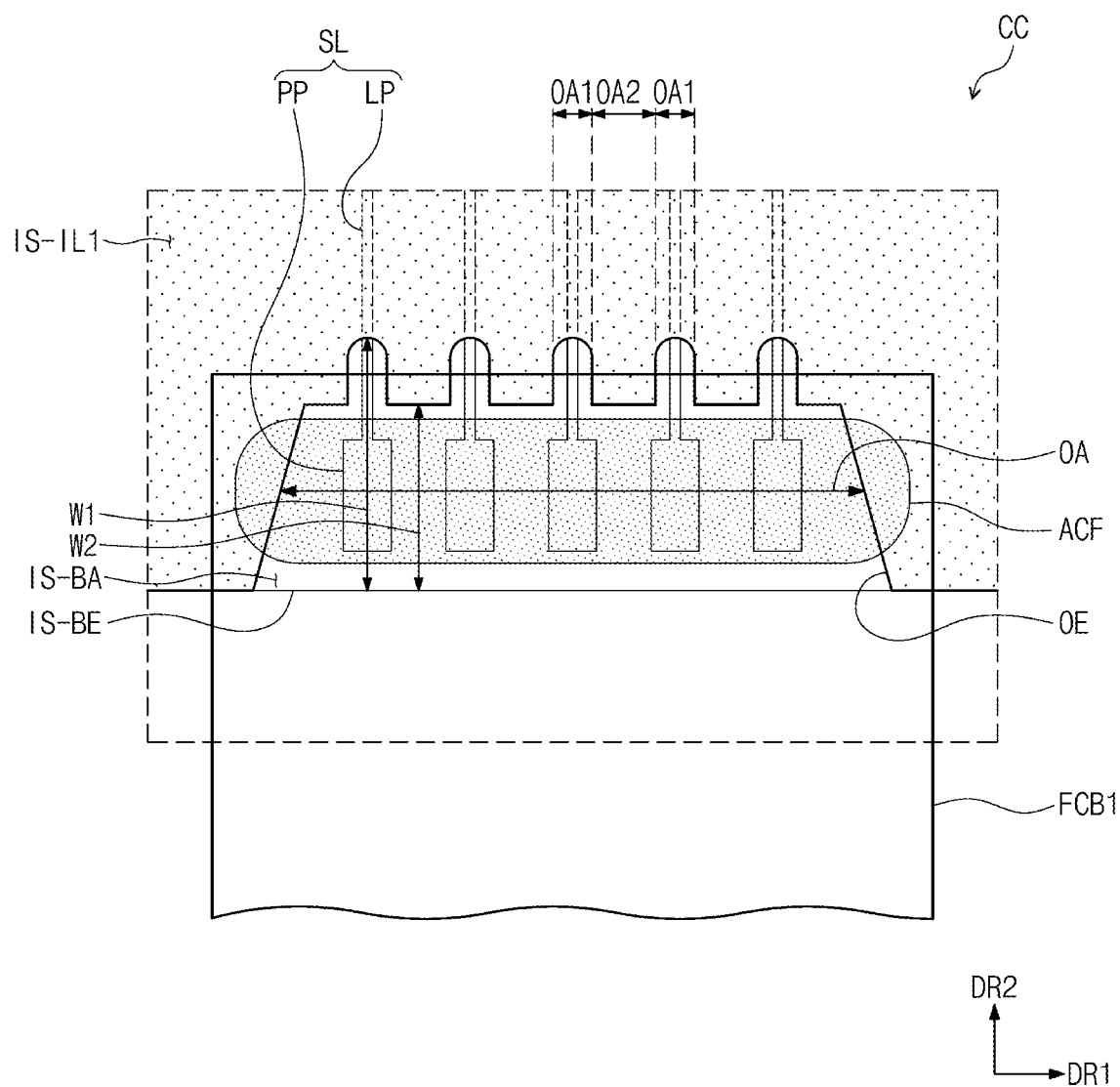
FIGS. 9A and 9B are enlarged plan views showing a bonding area of an electronic panel according to an exemplary embodiment.
Figure 9B:
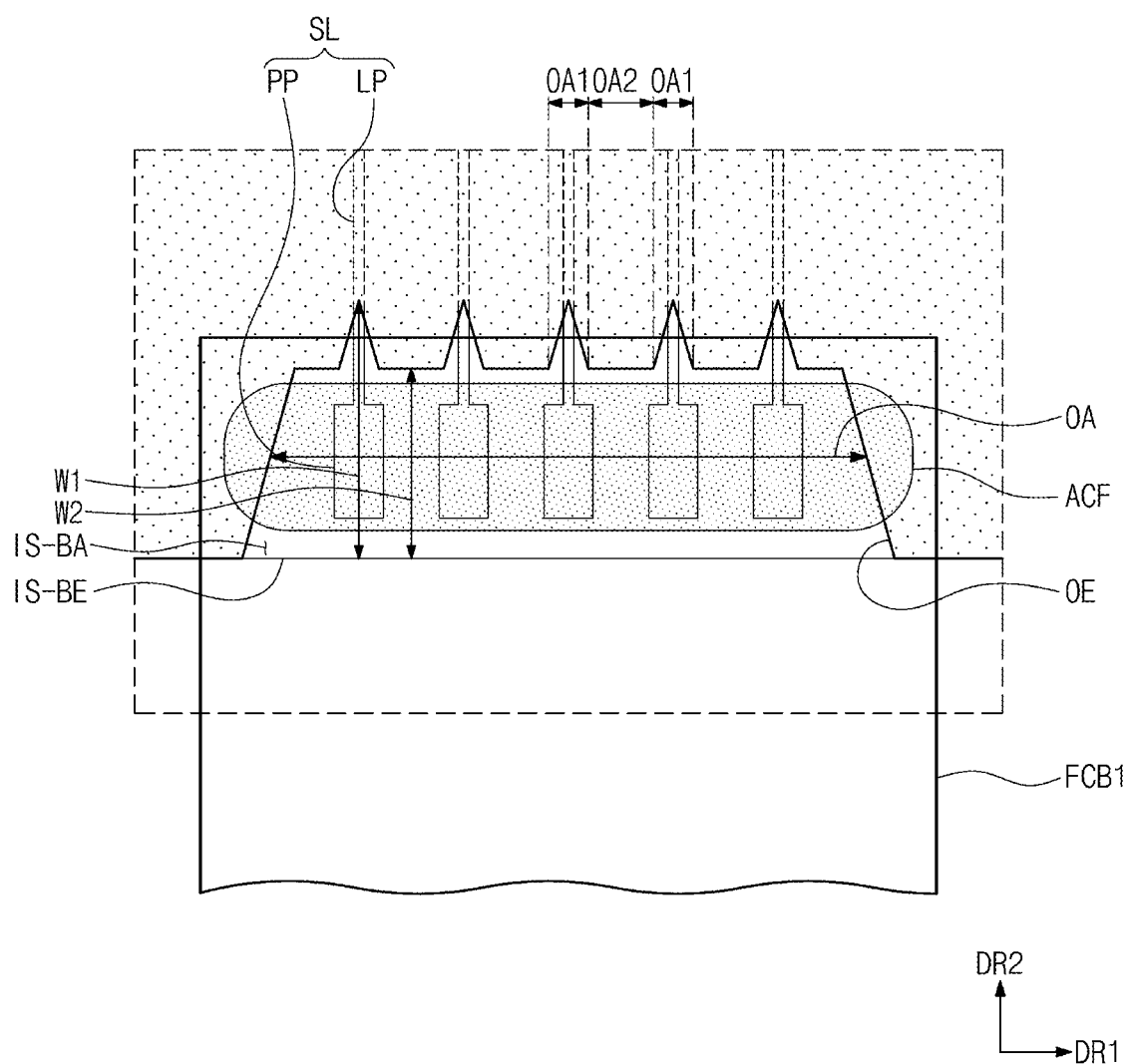

FIGS. 9A and 9B are enlarged plan views showing a bonding area of an electronic panel according to exemplary embodiments. Hereinafter, repeated descriptions of the same elements as those described with reference to FIGS. 7A to 8C will be omitted.

Referring to FIG. 9A, a portion of an open edge OE that defines a first open area OA1 may have a curved line shape. Referring to FIG. 9B, a portion of an open edge OE that defines a first open area OA1 may have a saw-tooth shape.

According to the exemplary embodiments, cracks may be prevented from occurring in the area adjacent to the edge of the insulating layer by controlling the thickness of an area adjacent to the edge of the insulating layer. Although a pressing tool may be used in the process of bonding the electronic panels, and the stress is applied to the insulating layer, cracks may be prevented or at least be suppressed from occurring. In this manner, the signal line may be prevented from being corroded.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic panel comprising:
   a display panel; and
   an input sensor on the display panel, wherein the input sensor comprises:
- a base layer including a first surface and a second surface opposite to the first surface in a thickness direction;
- a first sensing electrode on the first surface and extended in a first direction;
- a first signal line disposed on the first surface and electrically connected to the first sensing electrode;
- a first insulating layer disposed on the first surface and overlapping the first sensing electrode;
- a second sensing electrode on the second surface and extended in a second direction crossing the first direction;
- a second signal line disposed on the second surface and electrically connected to the second sensing electrode; and
- a second insulating layer disposed on the second surface and overlapping the second sensing electrode,
wherein the first insulating layer includes an open edge that defines an open area, the open area exposes a portion of the first surface and a portion of the first signal line in a plan view, and
wherein the first insulating layer has a first thickness at a first point spaced apart from the open edge and a second thickness greater than the first thickness at a second point disposed farther away from the open edge than the first point.

2. The electronic panel of claim 1, wherein a thickness of the first insulating layer gradually decreases from the second point to the open edge.

3. The electronic panel of claim 1, wherein the first insulating layer has a step between the second point and the open edge.

4. The electronic panel of claim 1, wherein the first insulating layer includes an organic layer contacting the first signal line.

5. The electronic panel of claim 1, wherein the second insulating layer includes an open edge that defines an open area, the open area exposes a portion of the second surface and a portion of the second signal line in a plan view, and
wherein the second insulating layer has a third thickness at a third point spaced apart from the open edge defined in the second insulating layer and a fourth thickness greater than the third thickness at a fourth point disposed farther away from the open edge defined in the second insulating layer than the third point.

6. The electronic panel of claim 5, wherein the open area defined in the second insulating layer does not overlap the open area defined in the first insulating layer in a plan view.

7. The electronic panel of claim 1, wherein the first signal line comprises a transparent conductive layer.

8. The electronic panel of claim 7, wherein the first signal line further comprises a metal layer on the transparent conductive layer.

9. The electronic panel of claim 1, further comprises an optical sheet positioned between the display panel and the input sensor.

10. The electronic panel of claim 1, further comprises a circuit board electrically connected to the portion of the first signal line through the open area defined in the first insulating layer.

11. The electronic panel of claim 10, wherein the open area defined in the first insulating layer includes a first area having a first width and a second area having a second width,
the first area overlaps the first signal line and the second area does not overlap with the first signal line, and
the first width is greater than the second width.

12. The electronic panel of claim 11, wherein the circuit board overlaps the first area and the second area, and does not overlap with a first portion of the first area.

13. The electronic panel of claim 12, further comprising an anisotropic conductive material disposed between the first signal line and the circuit board.

14. The electronic panel of claim 13, wherein the anisotropic conductive material overlaps the first portion of the first area.

15. The electronic panel of claim 11, wherein the circuit board completely overlaps the open area defined in the first insulating layer.

16. The electronic panel of claim 11, wherein the display panel includes a first non-bending area, a bending area configured to be bent with respect to the first non-bending area, and a second non-bending area extending from the bending area, and
the input sensor is positioned on the first non-bending area.

17. The electronic panel of claim 16, wherein the circuit board is bent along the bending area.

18. The electronic panel of claim 1, wherein the open area defined in the first insulating layer extends to an edge of the base layer when viewed in a plan view.

* * * * *